US012509768B2

(12) United States Patent
Takagi et al.

(10) Patent No.: US 12,509,768 B2
(45) Date of Patent: Dec. 30, 2025

(54) METHOD OF MANUFACTURING SEMICONDUCTOR DEVICE, SUBSTRATE PROCESSING APPARATUS AND EVAPORATION SYSTEM

(71) Applicant: KOKUSAI ELECTRIC CORPORATION, Tokyo (JP)

(72) Inventors: Kosuke Takagi, Toyama (JP); Yuji Takebayashi, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 4 days.

(21) Appl. No.: 17/509,791

(22) Filed: Oct. 25, 2021

(65) Prior Publication Data

US 2022/0042170 A1 Feb. 10, 2022

Related U.S. Application Data

(62) Division of application No. 13/850,735, filed on Mar. 26, 2013, now abandoned.

(30) Foreign Application Priority Data

Apr. 6, 2012 (JP) ................................ 2012-087838
Feb. 13, 2013 (JP) ................................ 2013-025544

(51) Int. Cl.

| | |
|---|---|
| ***C23C 16/448*** | (2006.01) |
| ***C23C 16/40*** | (2006.01) |
| ***C23C 16/44*** | (2006.01) |
| ***C23C 16/455*** | (2006.01) |
| ***H01L 21/02*** | (2006.01) |

(52) U.S. Cl.
CPC ........ *C23C 16/4485* (2013.01); *C23C 16/405* (2013.01); *C23C 16/4402* (2013.01); *C23C 16/45546* (2013.01); *H01L 21/02104* (2013.01)

(58) Field of Classification Search
None
See application file for complete search history.

(56) References Cited

U.S. PATENT DOCUMENTS 3,693,457 A 9/1972 Pilat
4,419,107 A 12/1983 Roydhouse
4,640,140 A 2/1987 Burghoffer et al.
(Continued)

FOREIGN PATENT DOCUMENTS

EP 0013170 A1 * 7/1980 ................ F24F 6/02
JP 5-239652 A 9/1993
(Continued)

OTHER PUBLICATIONS

Japanese Notification of Reasons for Refusal, JP Application No. 201-025544, Nov. 17, 2016, 3 pages (English Translation Provided).

*Primary Examiner* — David P Turocy
(74) *Attorney, Agent, or Firm* — Volpe Koenig

(57) ABSTRACT

An amount of particles generated when a source material is used is suppressed. A substrate is loaded into a process chamber, and the source material is sequentially flowed into an evaporator, and a mist filter constituted by assembling a plurality of at least two types of plates including holes disposed at different positions to be evaporated and supplied into the process chamber to process the substrate, and then, the substrate is unloaded from the process chamber.

20 Claims, 22 Drawing Sheets

(56) References Cited

U.S. PATENT DOCUMENTS

| | | | | | |
|---|---|---|---|---|---|
| 5,099,915 | A * | 3/1992 | VanDyke | F28F 3/086 165/166 |
| 5,383,970 | A | 1/1995 | Asaba et al. | |
| 5,458,664 | A | 10/1995 | Ishii et al. | |
| 6,331,211 | B1 | 12/2001 | Xu et al. | |
| 6,409,839 | B1 * | 6/2002 | Sun | C23C 16/448 392/397 |
| 6,415,736 | B1 | 7/2002 | Hao et al. | |
| 6,453,758 | B1 * | 9/2002 | Marple | G01N 15/0255 55/318 |
| 6,474,077 | B1 * | 11/2002 | Botelho | C23C 16/45561 62/45.1 |
| 2002/0014449 | A1 | 2/2002 | Rios et al. | |
| 2003/0198741 | A1 | 10/2003 | Uchida et al. | |
| 2005/0006799 | A1 | 1/2005 | Gregg et al. | |
| 2005/0147749 | A1 * | 7/2005 | Liu | C23C 16/4486 427/248.1 |
| 2007/0089674 | A1 | 4/2007 | Aitchison et al. | |
| 2007/0101940 | A1 * | 5/2007 | Iizuka | C23C 16/4486 118/726 |
| 2007/0234692 | A1 | 10/2007 | Midorikawa et al. | |
| 2007/0266944 | A1 * | 11/2007 | Iizuka | C23C 16/4486 118/722 |
| 2008/0296791 | A1 | 12/2008 | Okabe et al. | |
| 2009/0136668 | A1 | 5/2009 | Gregg et al. | |
| 2009/0325389 | A1 | 12/2009 | Takebayashi et al. | |
| 2012/0055402 | A1 | 3/2012 | Moriya et al. | |
| 2016/0222508 | A1 * | 8/2016 | Schoepp | C23C 16/4481 |

FOREIGN PATENT DOCUMENTS

| | | | | | |
|---|---|---|---|---|---|
| JP | 11-248884 | A | | 9/1999 | |
| JP | H11248844 | A | * | 9/1999 | C23C 16/405 |
| JP | 2004-071849 | A | | 4/2004 | |
| JP | 2006-077321 | A | | 3/2006 | |
| JP | 2007-225499 | A | | 9/2007 | |
| JP | 2010-028094 | A | | 2/2010 | |
| JP | 2010-255103 | A | | 11/2010 | |
| JP | 2011-124416 | A | | 6/2011 | |
| KR | 10-2008-0020561 | A | | 3/2008 | |
| KR | 2008020561 | A | * | 3/2008 | C23C 16/405 |

* cited by examiner

<PRIOR ART>

<PRIOR ART>

METHOD OF MANUFACTURING SEMICONDUCTOR DEVICE, SUBSTRATE PROCESSING APPARATUS AND EVAPORATION SYSTEM

CROSS-REFERENCE TO RELATED PATENT APPLICATION

This U.S. non-provisional patent application is a divisional of and claims priority to U.S. patent application Ser. No. 13/850,735 filed on Mar. 26, 2013 which claims priority under 35 U.S.C. § 119 of Japanese Patent Application No. 2012-087838 filed on Apr. 6, 2012 and Japanese Patent Application No. 2013-025544 filed on Feb. 13, 2013, in the Japanese Patent Office, the entire contents of which are hereby incorporated by reference.

BACKGROUND OF THE INVENTION

1. Field of the Invention

The present invention relates to a method of manufacturing a semiconductor device, a substrate processing apparatus and an evaporation system, and more particularly, to a method of manufacturing a semiconductor device including a process of processing a semiconductor wafer using liquid source and a substrate processing apparatus and an evaporation system which are exemplarily used therein.

2. Description of the Related Art

A technique of forming a film on a substrate using liquid source is disclosed in Patent Document 1 as one process of processes of manufacturing a semiconductor device.

RELATED ART DOCUMENT

Patent Document

Japanese Patent Application Laid-Open No. 2010-28094

SUMMARY OF THE INVENTION

When substrate processing such as film-forming is performed using liquid source, a source gas, which is gasified by evaporating the liquid source, is used. However, when a film is formed on a semiconductor wafer using such a source material, particles may be generated on the wafer due to bad evaporation. In addition, the evaporated source gas may be reliquefied such that the liquid source cannot be efficiently supplied into a process chamber.

It is an aspect of the present invention to provide a method of manufacturing a semiconductor device, a substrate processing apparatus, and an evaporation system that are capable of suppressing an amount of particles generated when liquid source is used and efficiently evaporating liquid source to supply the evaporated fuel into a process chamber.

According to an aspect of the present invention, there is provided a method of manufacturing a semiconductor device, including: (a) loading a substrate into a process chamber; (b) evaporating a source material by sequentially flowing the source material to an evaporator and a mist filter including one or more first plates and one or more second plates; (c) supplying the source material evaporated in the step (b) into the process chamber to process the substrate; and (d) unloading the substrate from the process chamber, wherein each of the one or more first plates includes one or more first holes, and each of the one or more second plates includes one or more second holes disposed at different positions from those of the one or more first holes.

According to another aspect of the present invention, there is provided a substrate processing apparatus including: a process chamber configured to accommodate a substrate; a process gas supply system configured to supply a process gas into the process chamber; and an exhaust system configured to exhaust the process chamber, wherein the process gas supply system includes: an evaporator configured to receive a source material; and a mist filter disposed at a downstream side of the evaporator, and including one or more first plates and one or more second plates, wherein each of the one or more first plates includes one or more first holes, and each of the one or more second plates includes one or more second holes disposed at different positions from those of the one or more first holes.

According to another aspect of the present invention, there is provided an evaporation system including: an evaporator configured to receive a source material; and a mist filter disposed at a downstream side of the evaporator and including one or more first plates and one or more second plates, wherein each of the one or more first plates includes one or more first holes, and each of the one or more second plates includes one or more second holes disposed at different positions from those of the one or more first holes.

and

Figure 17:
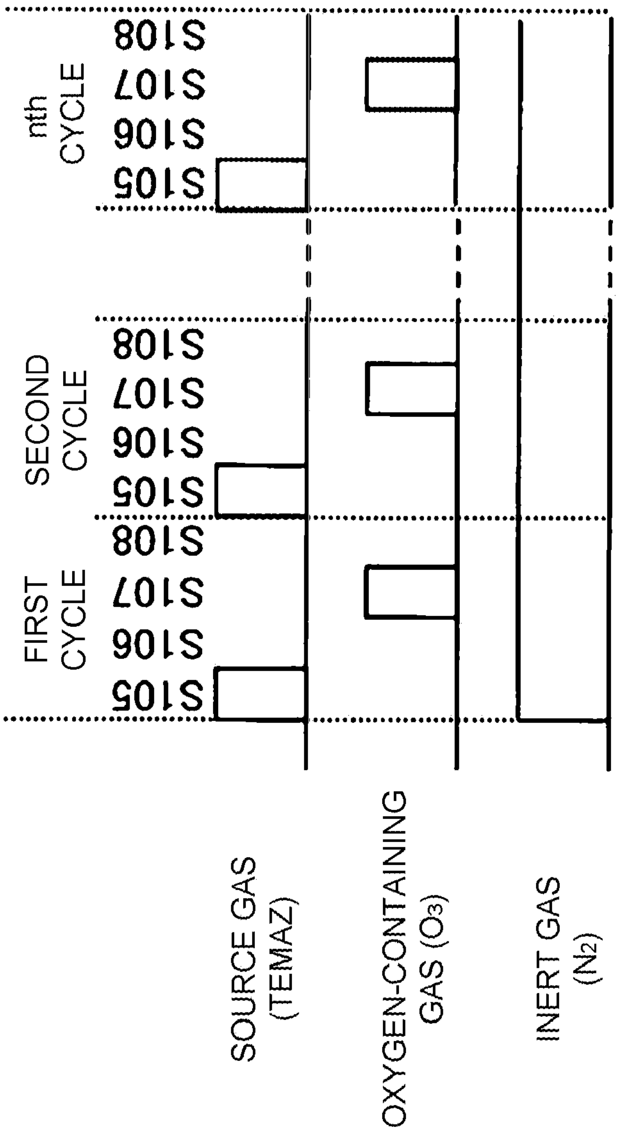

FIG. 17 is a timing chart for describing a process of manufacturing a zirconium oxide film using the substrate processing apparatus of the exemplary embodiment of the present invention.

DETAILED DESCRIPTION OF THE PREFERRED EMBODIMENTS

Next, an exemplary embodiment of the present invention will be described.

First, a source material supply system exemplarily used in a substrate processing apparatus of an exemplary embodiment of the present invention will be described.

When the substrate processing such as film-forming or the like is performed using the liquid source as described above, a source gas, which is gasified by evaporating the liquid source, is used. In order to evaporate the liquid source, (1) raising a temperature, and (2) lowering a pressure are very important. However, in a process of manufacturing a semiconductor device, since various restrictions due to apparatus configurations or process conditions are provided, for example, when the temperature cannot be excessively increased or the pressure cannot be sufficiently lowered, it is difficult to form an appropriate evaporation line.

When the processing such as the film-forming is performed on the semiconductor wafer using the source gas, which is gasified by evaporating the liquid source as described above, particles may be generated on the wafer or the evaporated gas may be reliquefied. The inventors have keenly researched these problems and obtained the following knowledge.

Figure 1:
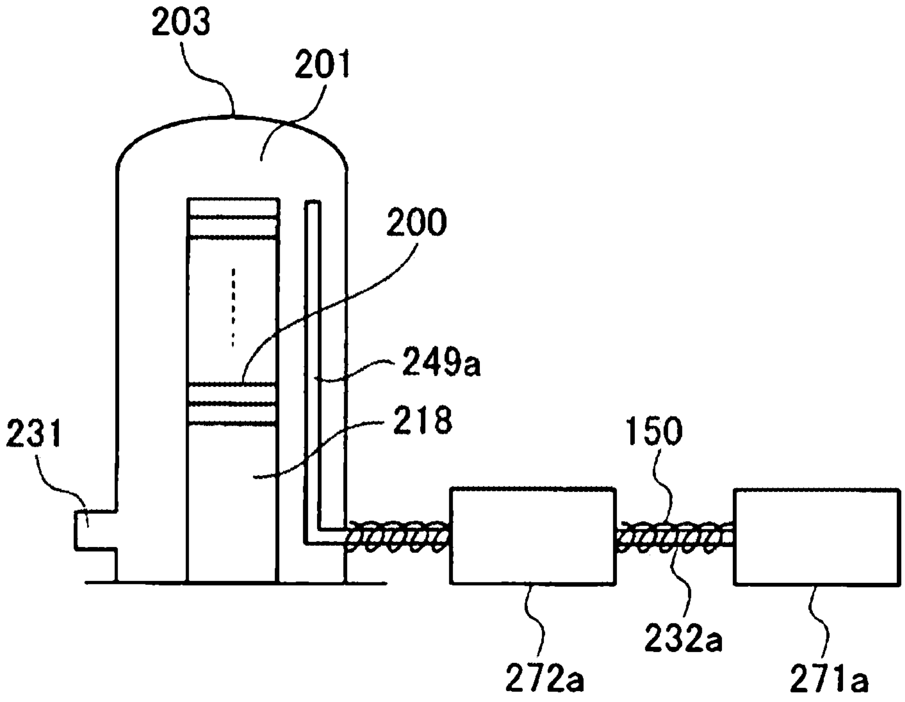
FIG. 1 is a schematic view for describing a conventional source material supply system for the purpose of comparison.

As shown in FIG. 1, in the substrate processing apparatus in which a gas filter 272*a* is installed in a gas supply pipe 232*a* from an evaporator 271*a* configured to evaporate the liquid source to a process chamber 201, the gas filter 272*a* can collect droplets or particles which are caused to be badly evaporated from the evaporator 271*a* or particles from the gas supply pipe 232*a*. In addition, a heater 150 may be installed at the gas supply pipe 232*a* from the evaporator 271*a* to the process chamber 201 to heat the source gas passing through the gas supply pipe 232*a*.

Figure 6:
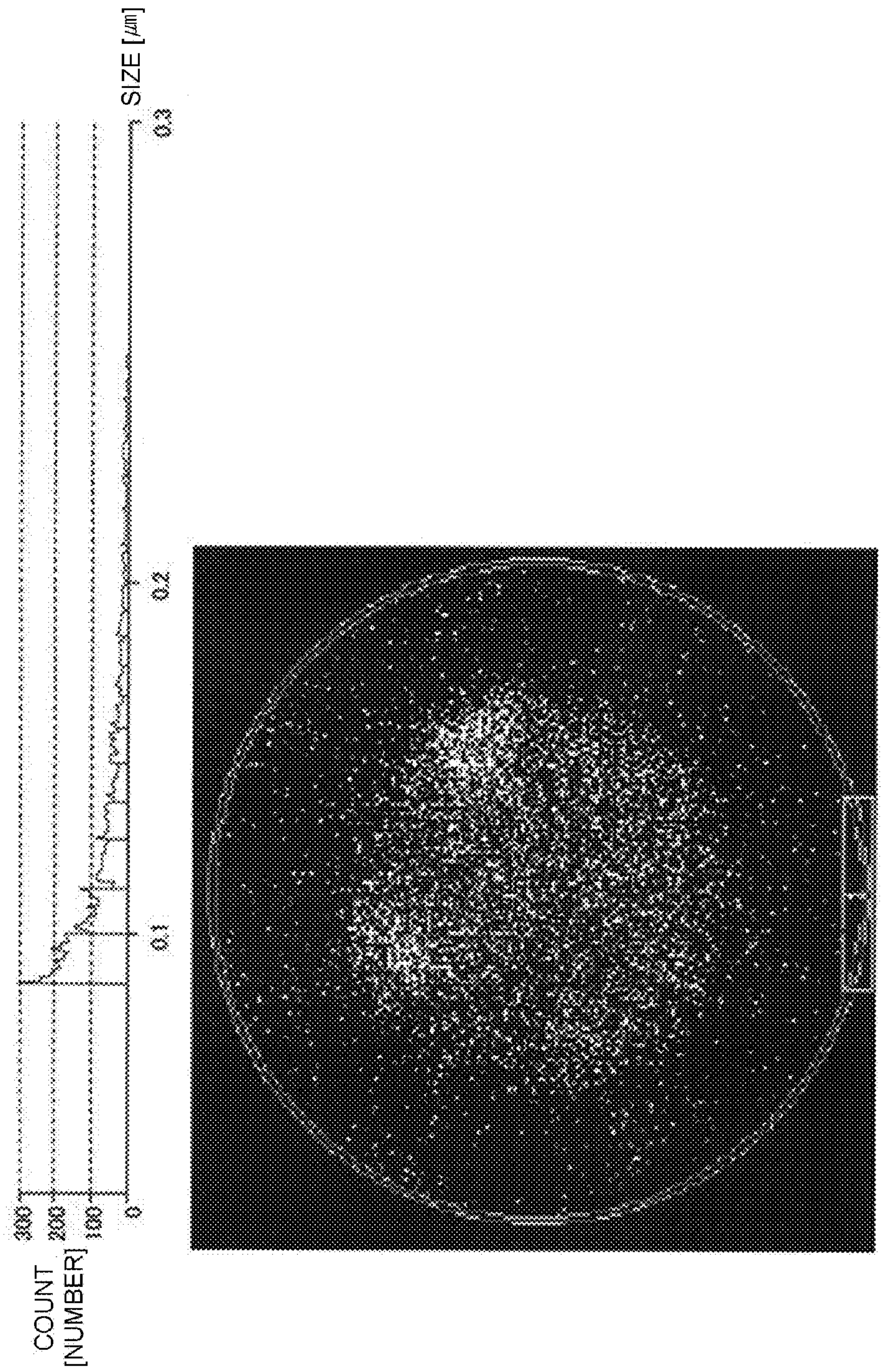
FIG. 6 is a view for describing a status of particles when the conventional source material supply system is used.

However, when the liquid source that cannot be easily evaporated by the evaporator 271*a* (a vapor pressure is low) is used or a required evaporation flow rate is high, the particles or the droplets due to bad evaporation cannot be completely collected by the gas filter 272*a*. When the film-forming is performed in this state, as shown in FIG. 6, particles are increased on a wafer 200. In addition, the gas filter 272*a* may be clogged and become a particle source. Further, when the clogging occurs, the filter of the gas filter 272*a* should be replaced with a new one.

Figure 2:
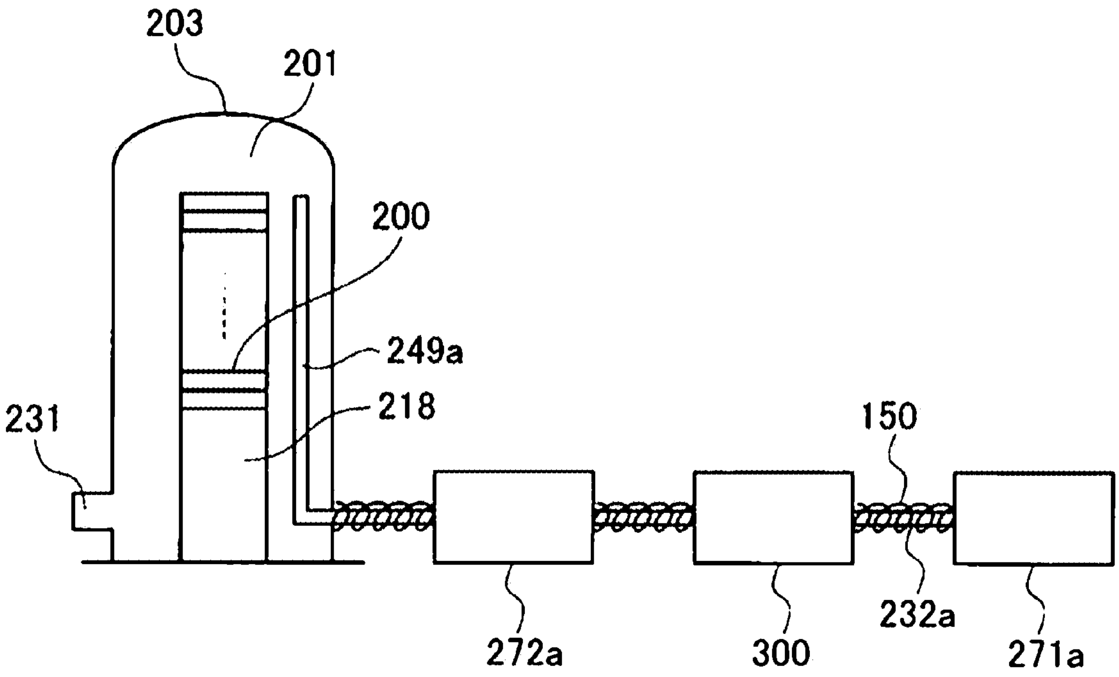
FIG. 2 is a schematic view for describing a source material supply system of an exemplary embodiment of the present invention.

For this reason, as shown in FIG. 2, the inventors proposed installing a mist filter (mist killer) 300 at the gas supply pipe 232*a* between the evaporator 271*a* and the gas filter 272*a*. In addition, the heater 150 is installed at the gas supply pipe 232*a* from the evaporator 271*a* to the process chamber 201 to heat the source gas passing through the gas supply pipe 232*a*.

Figure 3:
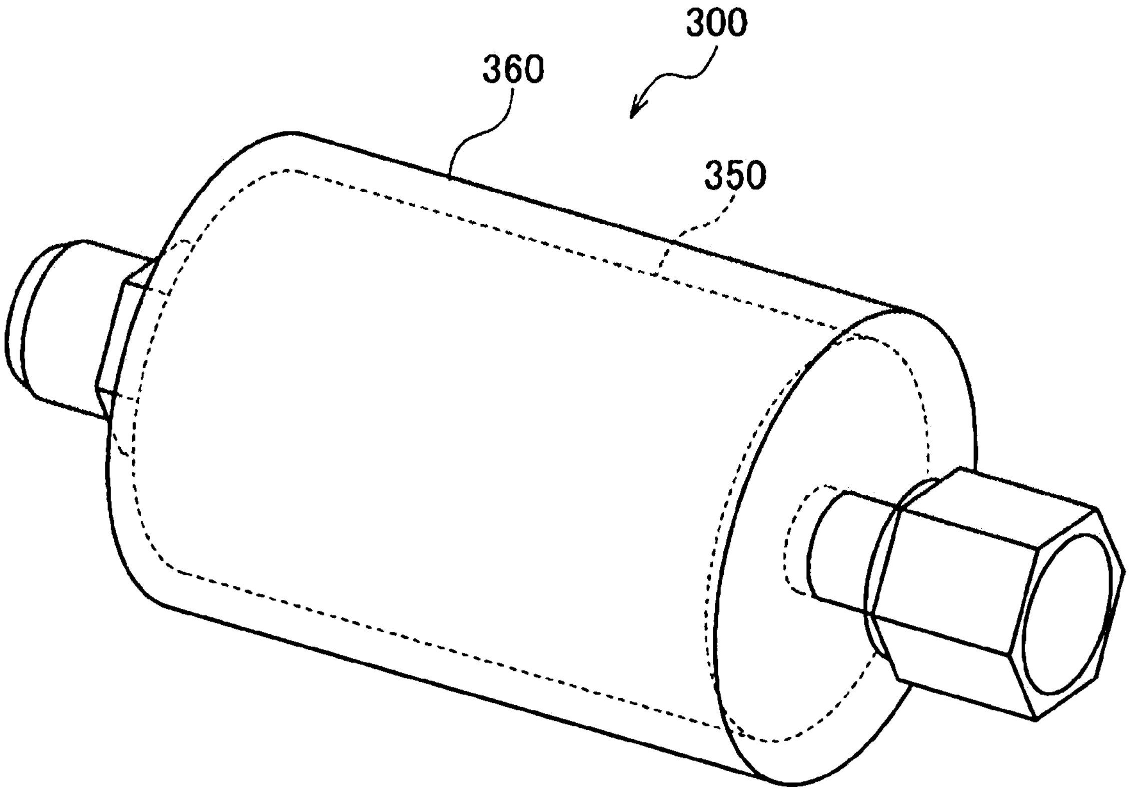
FIG. 3 is a schematic perspective view for describing a mist filter exemplarily used in the exemplary embodiment of the present invention.

Referring to FIG. 3, the mist filter 300 includes a mist filter main body 350, and a heater 360 installed outside the mist filter main body 350 and configured to cover the mist filter main body 350.

Figure 4:
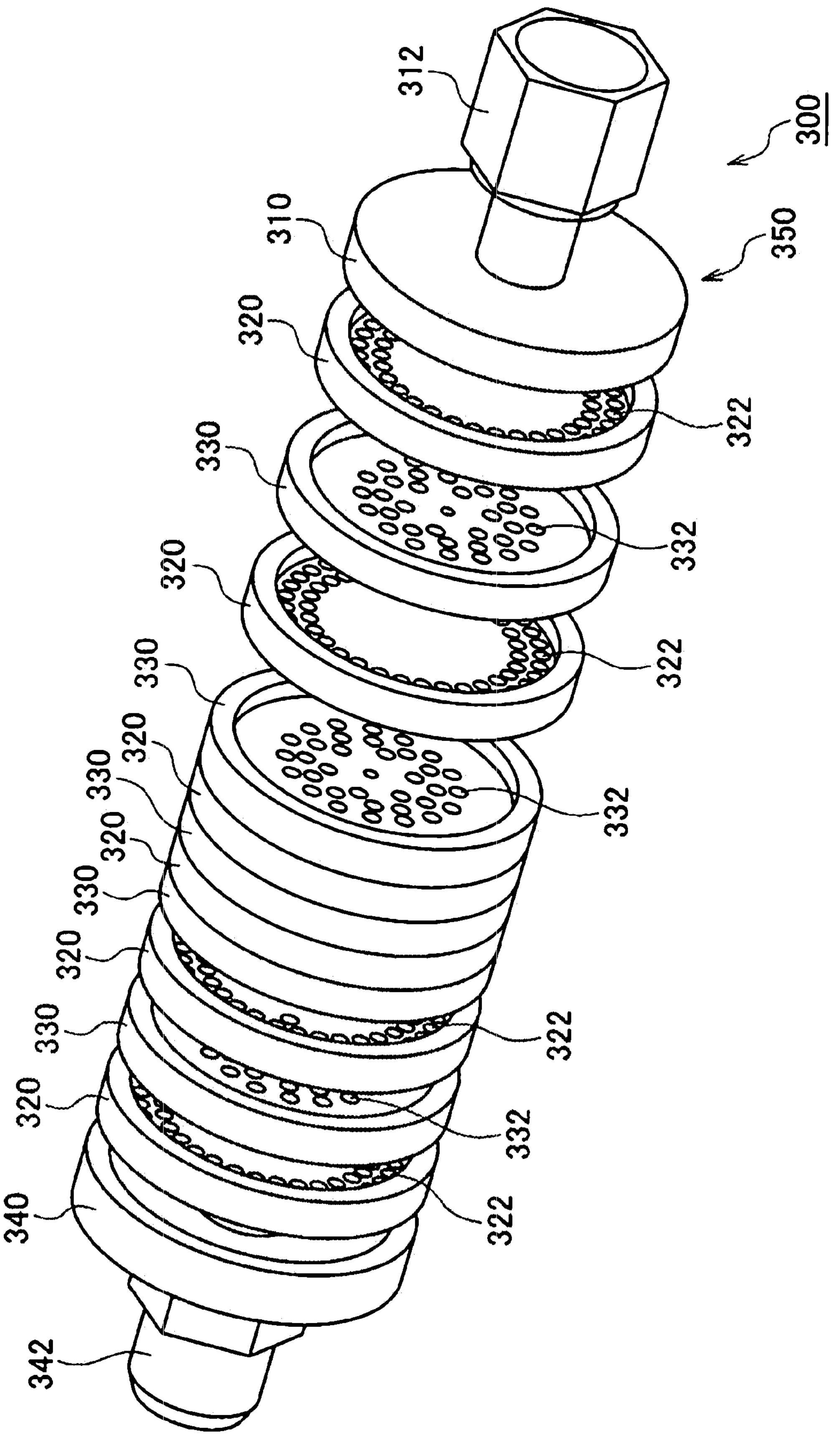
FIG. 4 is a schematic exploded perspective view for describing the mist filter exemplarily used in the exemplary embodiment of the present invention.
Figure 5:
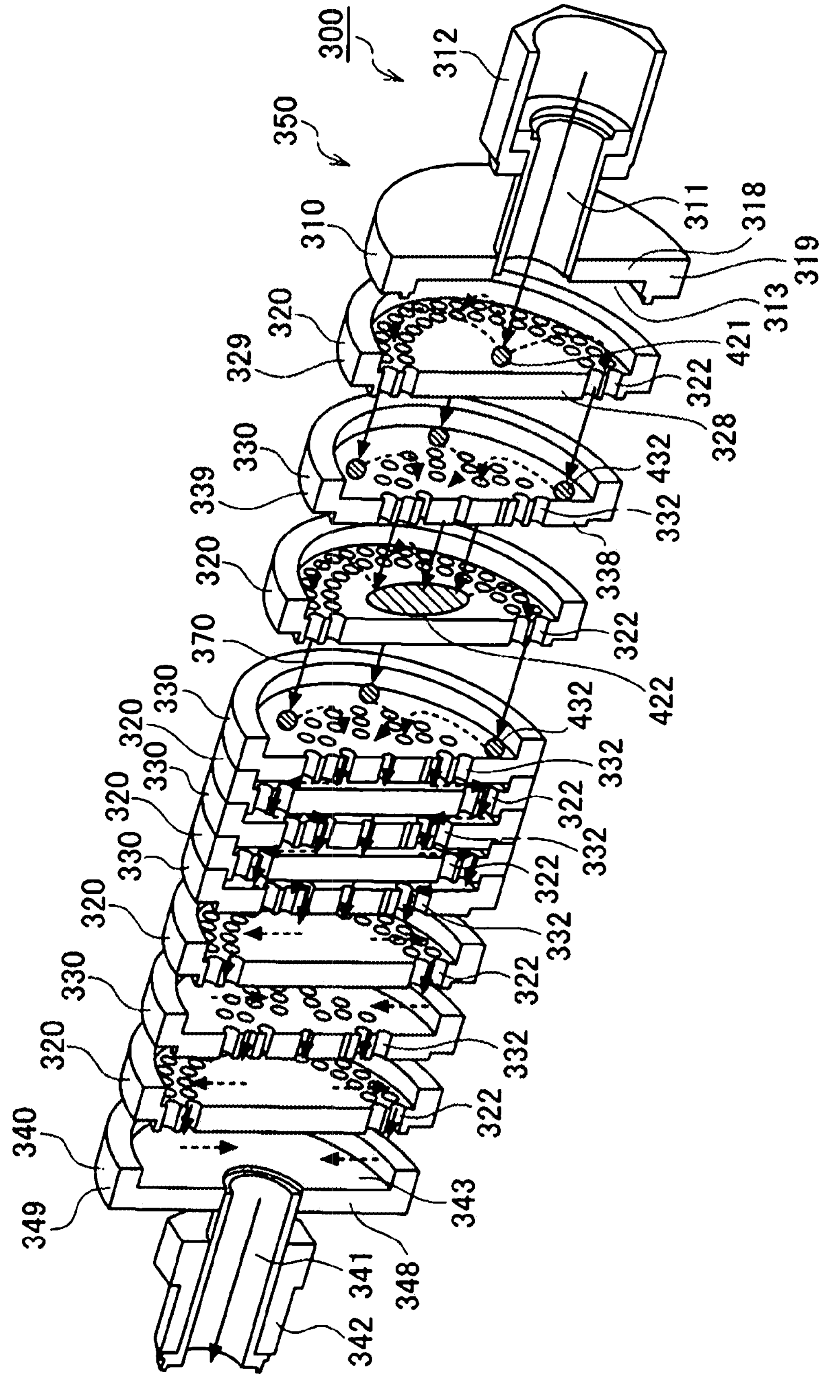
FIG. 5 is a schematic exploded perspective view for describing the mist filter exemplarily used in the exemplary embodiment of the present invention.

Referring to FIGS. 4 and 5, the mist filter main body 350 of the mist filter 300 includes end plates 310 and 340 of both ends, and two types of plates 320 and 330 disposed between the end plates 310 and 340. The two types of plates 320 and 330 include a first plate 320 and a second plate 330. A joint 312 is installed at the end plate 310 of an upstream side. A joint 342 is installed at the end plate 340 of a downstream side. A gas path 311 is disposed in the end plate 310 and the joint 312. A gas path 341 is disposed in the end plate 340 and the joint 342. The joint 312 and the joint 342 (the gas path 311 and the gas path 341) are connected to the gas supply pipe 232*a*.

Each of the two types of plates 320 and 330 is installed in plural and alternately disposed between the end plates 310 and 340. The plate 320 includes a flat plate section 328, and an outer circumferential section 329 disposed at an outer circumference of the plate section 328. A plurality of holes 322 are disposed in the plate section 328 only near the outer circumference thereof. The plate 330 includes a flat plate section 338, and an outer circumferential section 339 disposed at an outer circumference of the plate section 338. A plurality of holes 332 are disposed in the plate section 338 only near a center thereof (i.e., at different positions from the positions at which the holes 322 are disposed in the plate section 328). The mist filter 300 is constituted by assembling the plates 320 and the plates 330.

The plates 320 and the plates 330 have the same or substantially the same shape except for formation positions of the holes 322 and 332. The flat plate section 328 and the plate section 338 have circular shapes when seen in a plan view, and have the same or substantially the same shape except for formation positions of the holes 322 and 332. The holes 322 are disposed on concentric circles around the outer circumference of the plate section 328. The holes 332 are disposed in concentric circles around a center of the plate section 338. Here, the circles in which the holes 322 are disposed and the circles in which the holes 332 are disposed have different radii. Specifically, the radii of the circles in which the holes 322 are disposed are larger than those of the circles in which the holes 332 are disposed. On other words, a region of the plate section 328 in which the holes 322 are disposed is different from a region of the plate section 338 in which the holes 332 are formed. The regions are disposed not to overlap each other in a stacking direction when the plates 320 and the plates 330 are alternately disposed (stacked or assembled). As the plates 320 and 330 are alternately disposed as described above, the holes 322 and the holes 332 are disposed to be deviated from an upstream side toward a downstream side of the mist filter 300. That is, the holes 322 and the holes 332 are disposed not to overlap each other from the upstream side to the downstream side of the mist filter 300.

The outer circumferential sections 329 and 339 of the plates 320 and 330 are thicker than the plate sections 328 and 338. As the outer circumferential sections 329 and 339 come in contact with the outer circumferential sections 329 and 339 of the adjacent plates, a space (to be described below) is disposed between the plate sections 328 and 338. In addition, the outer circumferential sections 329 and 339 are disposed at positions offset with respect to the plate sections 328 and 338. That is, a stepped portion is disposed between side surfaces of the outer circumferential sections 329 and 339 and side surfaces of the plate sections 328 and 338. More specifically, one surface of the outer circumferential sections 329 and 339 (one surface in the stacking direction of the plate 320 and the plate 330) protrudes from planes of the plate sections 328 and 338, and the other surface of the outer circumferential sections 329 and 339 is disposed on edge sections of the plate sections 328 and 338. Accordingly, when the plates 320 and the plates 330 are stacked, the outer circumferential section 329 of the plate 320 is inserted into the edge section of the plate section 338 of the plate 330, the outer circumferential section 339 of the plate 330 is inserted into the edge section of the plate section 328 of the plate 320, and thus the plates 320 and 330 are correspondingly coupled to each other.

As the plates 320 and 330 are alternately disposed as described above, a gas path 370 may become complicated, and probability of colliding droplets generated due to bad evaporation or reliquefaction with heated wall surfaces (the plate sections 328 and 338) may be increased. In addition, the size of the holes 322 and 332 is set depending on a pressure in the mist filter main body 350, which is preferably a diameter of 1 to 3 mm. A basis of the lower limit value is that the holes are clogged when the size of the holes is too small. In addition, in the holes 332 disposed in the plate 330, the size of the holes disposed at the center may be smaller than that of the holes disposed around the center.

The source gas gasified by evaporating the liquid source using the evaporator 271*a* (see FIG. 2) and the droplets generated due to bad evaporation or reliquefaction are introduced into the mist filter main body 350 through the gas path 311 in the end plate 310 and the joint 312, and collide with a center portion 421 (a portion in which the holes 322 are not formed) of the plate section 328 of the one first plate 320. Then, they pass through the holes 322 disposed near the outer circumference of the plate section 328 and collide with an outer circumferential section 432 (a portion in which the holes 332 are not formed) of the flat plate section 338 of the second plate 330. Then, they pass through the holes 332 disposed near the center of the plate section 338 and collide with a center portion 422 (a portion in which the holes 322 are not formed) of the plate section 328 of the other first plate 320. Then, in the same method as described above, they sequentially pass the plates 330 and 320 to be ejected from the mist filter main body 350 through the gas path 341 in the end plate 340 and the joint 342, and are delivered to the gas filter 272*a* (see FIG. 2) of the downstream side.

The mist filter main body 350 is heated by the heater 360 (see FIG. 3) from the outside. The mist filter main body 350 includes the first plates 320 and the second plates 330, the first plate 320 includes the flat plate section 328 and the outer circumferential section 329 disposed at the outer circumference of the plate section 328, and the second plate 330 includes the flat plate section 338 and the outer circumferential section 339 disposed at the outer circumference of the plate section 338. Since the plate section 328 and the outer circumferential section 329 are integrally formed and the plate section 338 and the outer circumferential section 339 are integrally formed, when the mist filter main body is heated by the heater 360 from the outside, the heat is efficiently transferred to the flat plate sections 328 and 338. In addition, even if the plate section 328 and the outer circumferential section 329 are not integrally formed but are in full contact with each other, or if the plate section 338 and the outer circumferential section 339 are not integrally formed but are in full contact with each other, the heat from the heater 360 is also sufficiently transferred to the plate sections 328 and 338 efficiently.

In the mist filter main body 350, since the gas path 370 is configured to be complicated by the first plates 320 and the second plates 330 as described above, probability of the evaporated source gas and the droplets generated due to bad evaporation or reliquefaction colliding with the heated plate sections 328 and 338 can be increased without excessively increasing pressure loss in the mist filter main body 350. In addition, the droplets generated due to bad evaporation or reliquefaction collide with the heated plate sections 328 and 338 in the mist filter main body 350 having a sufficient calorie and is reheated and evaporated.

A material of the mist filter main body 350 may have heat conductivity equal to or higher than that of the material used in the evaporator 271*a* or a pipe 232*a*. In addition, the material may have corrosion resistance. Stainless use steel (SUS) may be used as a general material.

While the above description has been given as to a case where each of the plates 320 and the plates 330 are provided in plural numbers, it is also possible that the mist filter main body 350 includes at least one plate 320 and at least one plate 330. Similarly, although the above description has been given as to a case where each of the holes 322 and the holes 332 are provided in plural numbers, there may exist at least one hole 322 and at least one hole 332.

Next, a result of performing analysis of the mist filter main body 350 using numerical fluid mechanics analysis software (CFdesign) will be described. Dimensions of the mist filter main body 350, which is an analysis target, are set such that an outer diameter is 40 mm and an overall length is 127 mm.

Figure 7:
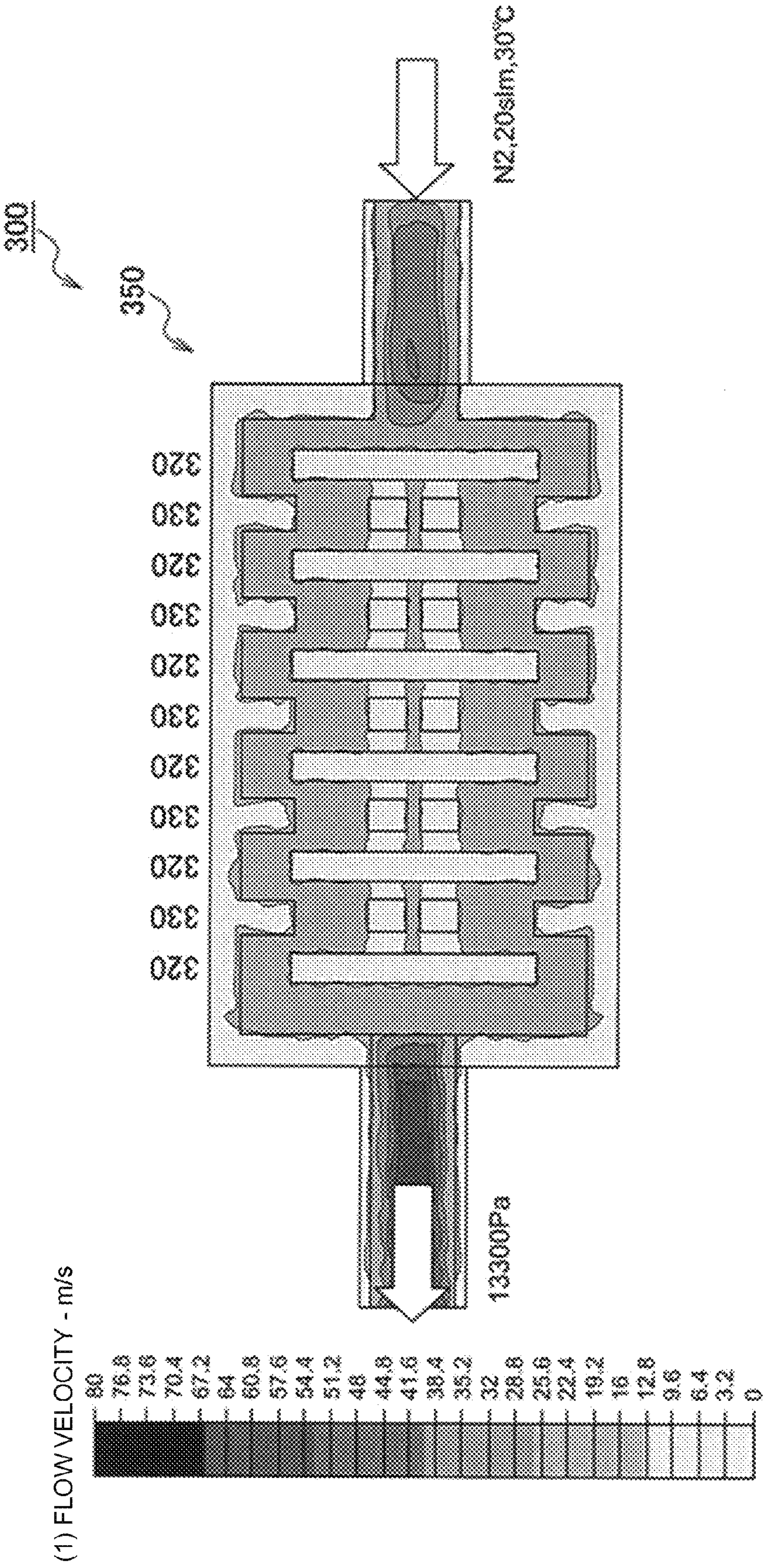
FIG. 7 is a schematic cross-sectional view for describing a flow velocity distribution in the mist filter exemplarily used in the exemplary embodiment of the present invention.
Figure 8:
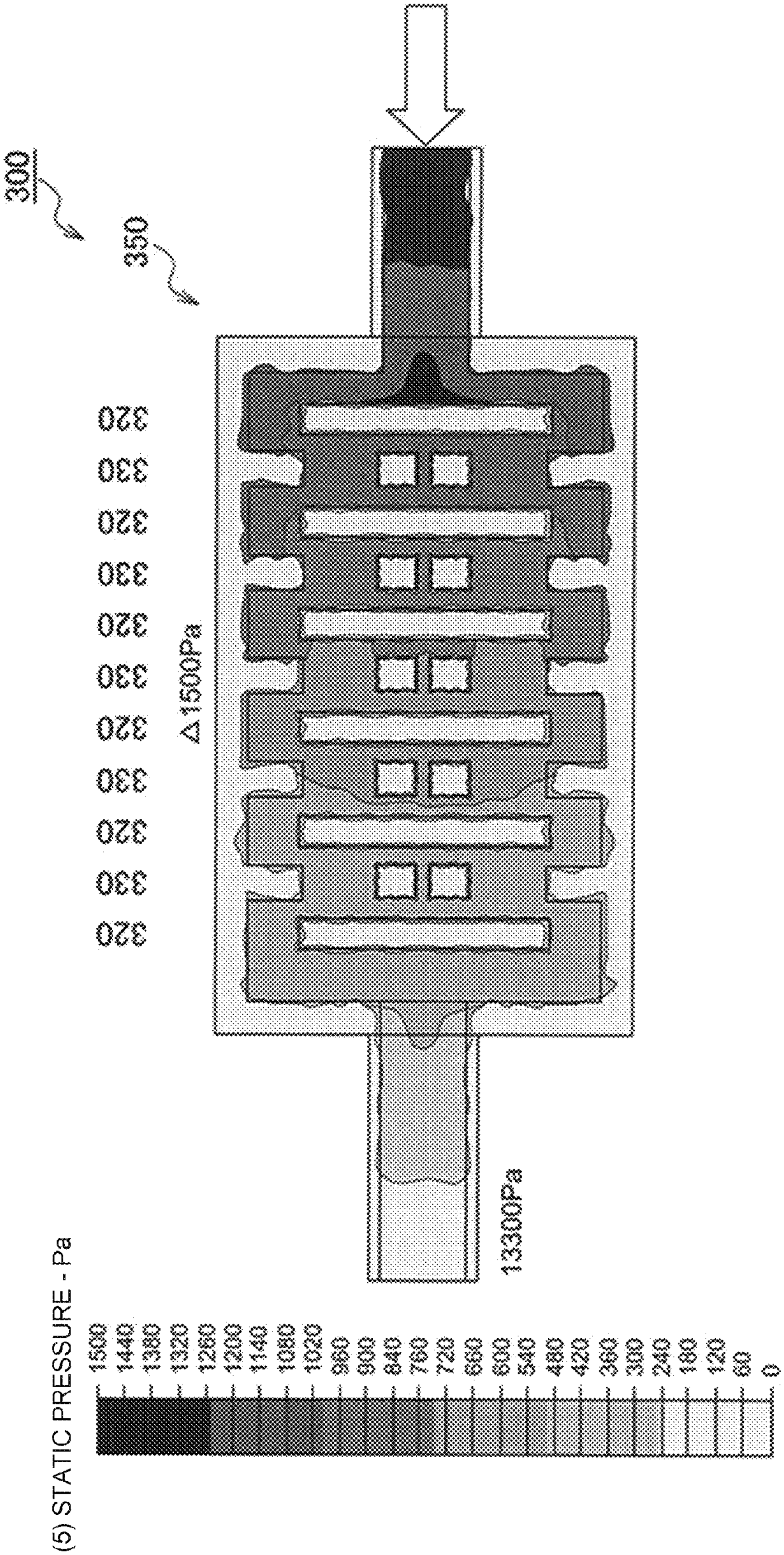
FIG. 8 is a schematic cross-sectional view for describing a pressure distribution in the mist filter exemplarily used in the exemplary embodiment of the present invention.
Figure 9:
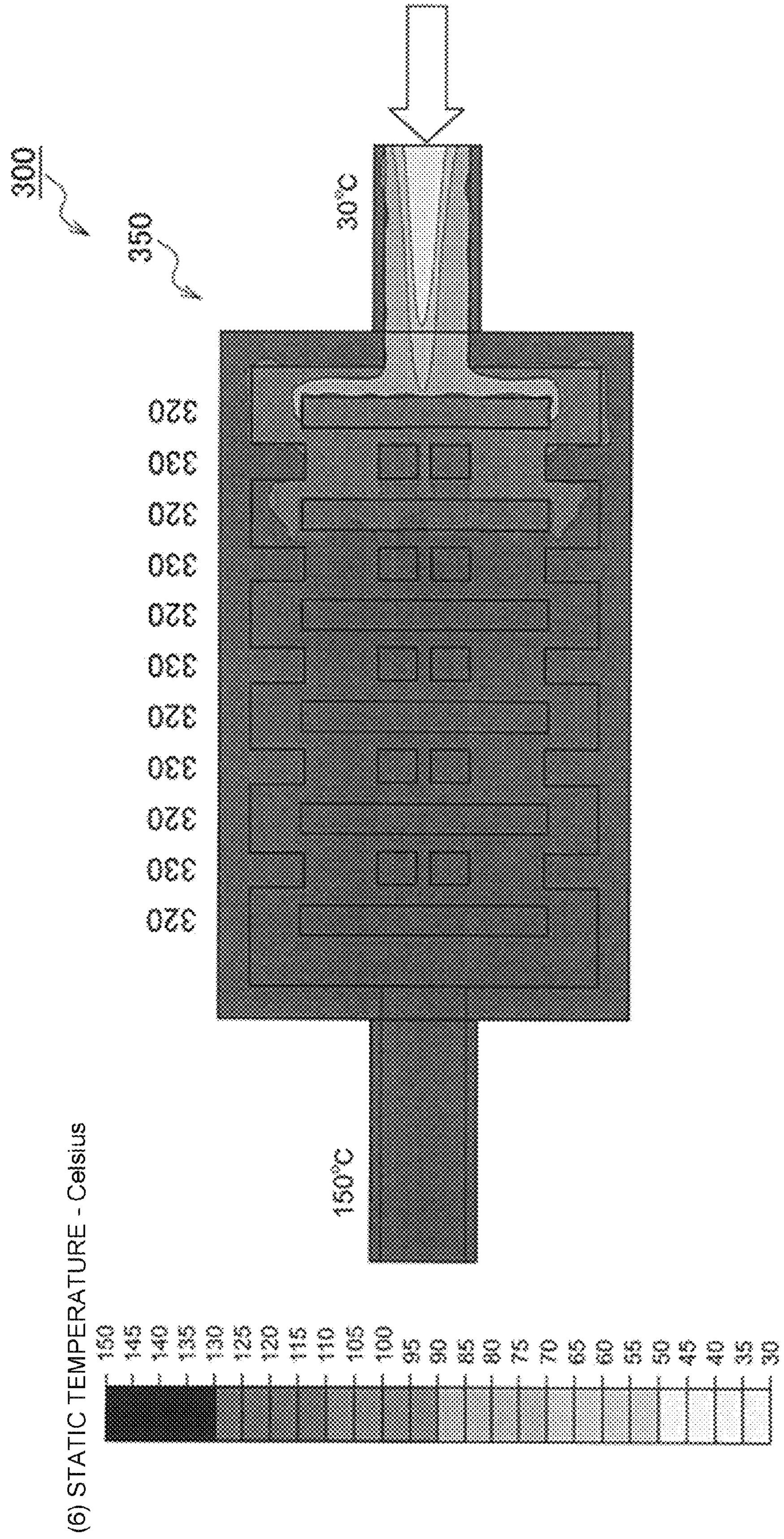
FIG. 9 is a schematic cross-sectional view for describing a temperature distribution in the mist filter exemplarily used in the exemplary embodiment of the present invention.

Referring to FIG. 7, the analysis was performed under the condition in which nitrogen ($N_2$) gas of 30° C. was supplied into the mist filter main body 350 at 20 slm and a pressure of an outlet side of the mist filter main body 350 was set as 13300 Pa. The pressure loss was 1500 Pa (see FIG. 8), and a $N_2$ gas of 30° C. arrived at 150° C. at a fourth plate among a first plate of the first plates 320, a first plate of the second plates 330, a second plate of the first plates 320, and a second plate of the second plates 330 (i.e., the second plate of the second plates 330) (see FIG. 9). The analysis was performed to satisfy the condition that, while different from an actual condition, was more unfavorable than the actual condition.

When the mist filter 300 is installed at the gas supply pipe 232*a* between the evaporator 271*a* and the gas filter 272*a* (see FIG. 2), the liquid source that cannot be easily evaporated or the droplets generated due to bad evaporation when the evaporation flow rate is large collide with the wall surface (the plate section 328) of the first plate 320 and the wall surface (the plate section 338) of the second plate 330 in the mist filter 300 having a sufficient calorie and are reheated and evaporated. Then, the droplets due to bad evaporation or the particles generated in the evaporator 271*a* and the mist filter 300, which minutely remain, are collected by the gas filter 272*a* just before the process chamber 201. The mist filter 300 functions to assist the evaporation, and supply a reaction gas with no droplets or particles generated due to bad evaporation into the process chamber 201 to perform the processing such as good film-forming or the like. In addition, the mist filter 300 can function to assist the gas filter 272*a* and suppress the clogging of the gas filter 272*a* to reduce maintenance of the gas filter 272*a* or lengthen a filter exchange period of the gas filter 272*a*.

As described above, the first plate 320 includes the flat plate section 328 and the outer circumferential section 329 disposed at the outer circumference of the plate section 328, and the second plate 330 includes the flat plate section 338 and the outer circumferential section 339 disposed at the outer circumference of the plate section 338 (see FIGS. 4 and 5).

In addition, the end plate 310 also includes a flat plate 318 and an outer circumferential section 319 disposed at an outer circumference of the plate 318, and the end plate 340 also includes a flat plate 348 and an outer circumferential section 349 disposed at an outer circumference of the plate 348 (see FIGS. 4 and 5). Further, spaces 323, 333, 313 and 343 are disposed inside the outer circumferential sections 329, 339, 319 and 349, respectively (see FIGS. 4, 5, and 10A). In addition, the end plate 310, the end plate 340, the first plate 320 and the second plate 330 are adhered to each other, for example, by welding at the outer circumferential sections 319, 349, 329 and 339 thereof to be hermetically connected to each other. Further, while the above-mentioned mist filter 300 is configured to include the first plate 320 and the second plate 330, the mist filter may include three or more plates having different formation positions of holes.

Figure 10A:
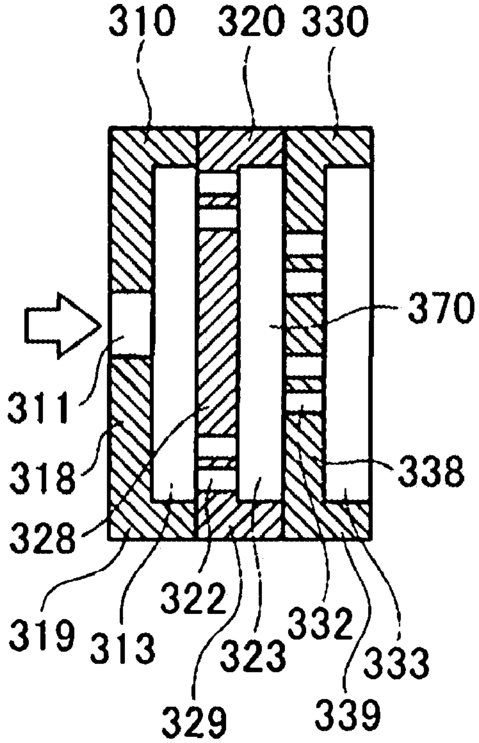
FIGS. 10A, 10B and 10C are schematic cross-sectional views for describing a variant of the mist filter exemplarily used in the exemplary embodiment of the present invention.

In the above-mentioned embodiment, no member is installed in the spaces 313, 323, 333 and 343 (see FIG. 10A). However, when the pressure loss of the entire mist filter main body 350 is within an allowable range, a sinter metal or the like may be filled in the spaces 313, 323, 333 and 343. The filled sintered metal is a material that can efficiently transfer the heat heated from the outside of the mist filter main body 350, and may have any shape such as a spherical shape, a granular shape, a non-linear shape, or the like, as long as the material can be filled into the spaces 313, 323, 333 and 343. Hereinafter, a variant of the above-mentioned embodiment will be described.

Figure 10B:
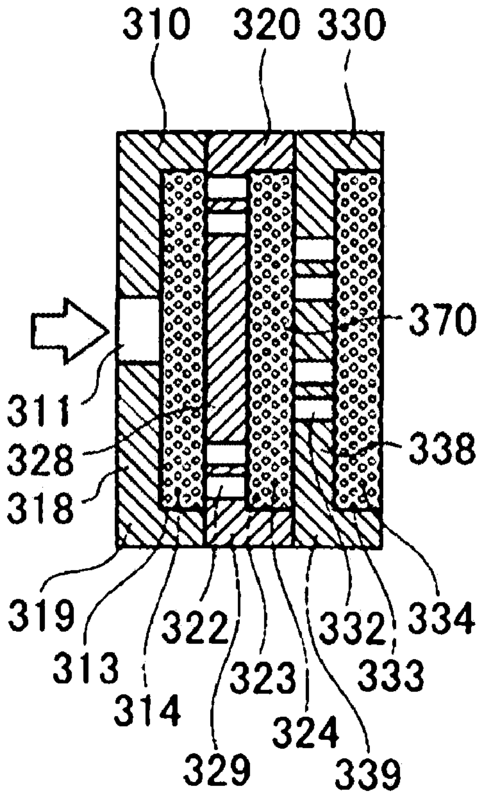

For example, as shown in FIG. 10B, sintered metals 314, 324 and 334 having a spherical shape such as a metal bowl, or the like, may be filled in the spaces 313, 323, and 333 (343). Since the size of the sphere and the pressure loss have a correlation, the size of the sphere is selected according to its purpose.

Figure 10C:
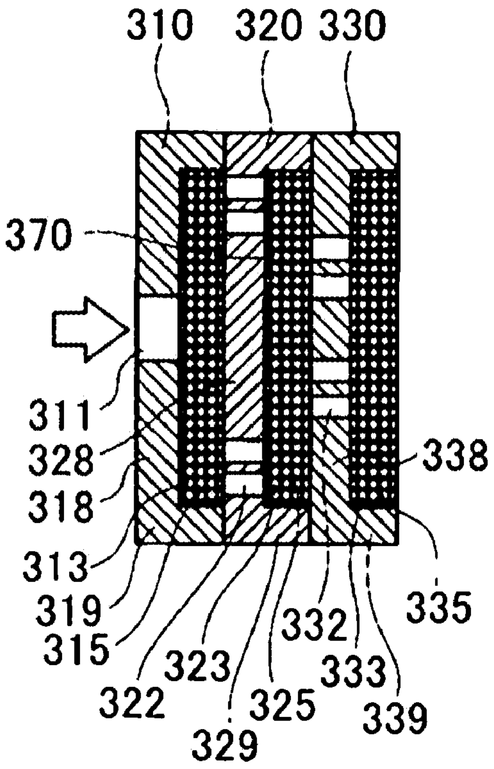

In addition, as shown in FIG. 10C, sintered metals 315, 325 and 335 having a granular shape may be filled in the spaces 313, 323, and 333 (343). The sintered metal having the granular shape has a size smaller than that of the sintered metal having the spherical shape.

Figure 11A:
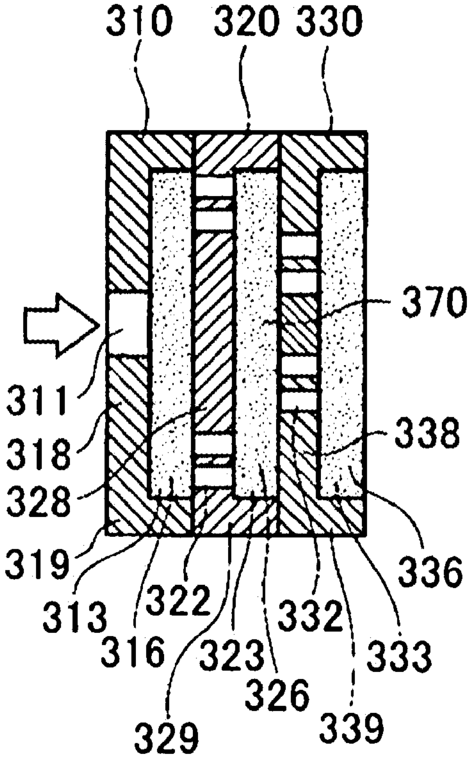
FIGS. 11A, 11B and 11C are schematic cross-sectional views for describing a variant of the mist filter exemplarily used in the exemplary embodiment of the present invention.

Further, as shown in FIG. 11A, sintered metals 316, 326 and 336 used in the gas filter or the like may be filled in the spaces 313, 323, and 333 (343).

Figure 11B:
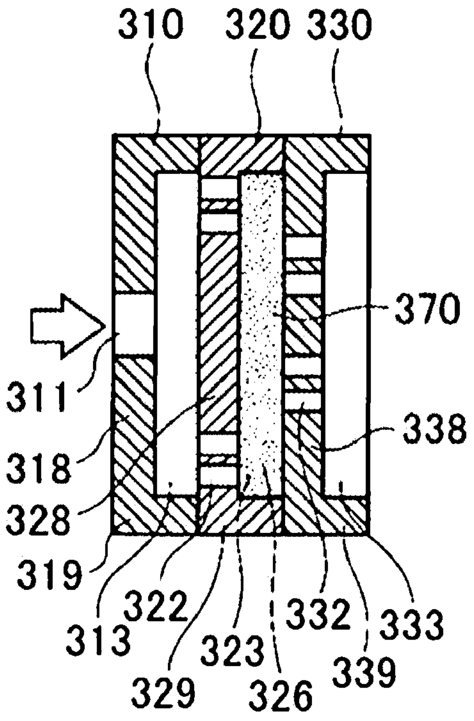

In addition, as shown in FIG. 11B, the sintered metal 326 used in the gas filter may be filled in the space 323 only, and no metal may be filled in the spaces 313, 333 and 343. A metal particle size and a fiber form before sintering of the sintered metal used in the gas filter are determined by the size of the collected particles. Since a shape that can collect more fine particles is densified, the pressure loss is also increased. Accordingly, it may be more effective and preferable for the sintered metal to be selectively filled into some of the spaces 313, 323, 333 and 343, rather than all of the spaces 313, 323, 333 and 343.

Figure 11C:
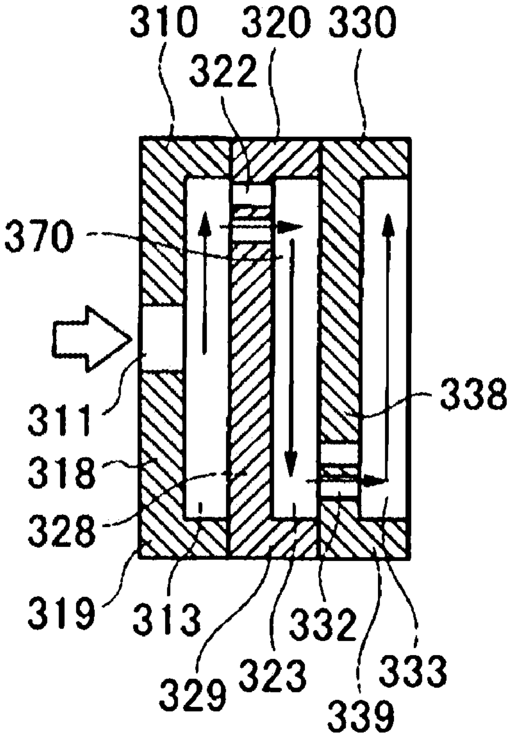

Further, as shown in FIG. 11C, as the plate section 328 of the first plate 320 has the holes 322 disposed at only one side of the outer circumference (a portion near the outer circumference) of the plate section 328 and the plate section 338 of the second plate 330 has the holes 332 disposed at only the other side of the outer circumference (a portion near the outer circumference and a position not overlapping the holes 322) of the plate section 338, the gas path 370 may be longer in comparison with the above-mentioned embodiment in which the holes 322 are disposed near the outer circumference of the plate section 328 and the holes 332 are disposed near the center of the plate section 338. In addition, in the embodiment, the same plates are used as the first plate 320 and the second plate 330 but may be stacked not to overlap the holes.

Figure 12A:
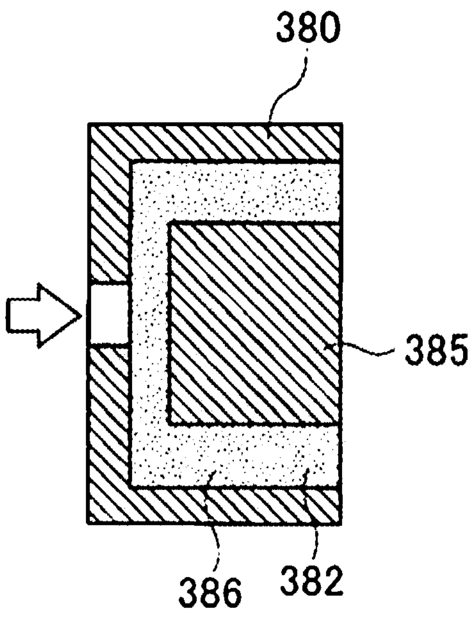
FIGS. 12A and 12B are schematic cross-sectional views for describing a variant of the mist filter exemplarily used in the exemplary embodiment of the present invention.

In addition, as shown in FIG. 12A, the mist filter main body 350 includes an outer vessel 380 having a cylindrical shape, an inner member 385, and a filling member 386 such as a sintered metal or the like filled in a gas path 382 disposed between the outer vessel 380 and the inner member 385. As the gas path 382 disposed between the outer vessel 380 and the inner member 385 is filled with the filling member 386 such as the sintered metal or the like, the entire mist filter main body 350 may be integrated such that the heat can be effectively transferred to the inner member 385. The outer vessel 380 and the inner member 385 may be made of, preferably, a metal member, and more preferably, stainless used steel (SUS).

Figure 12B:
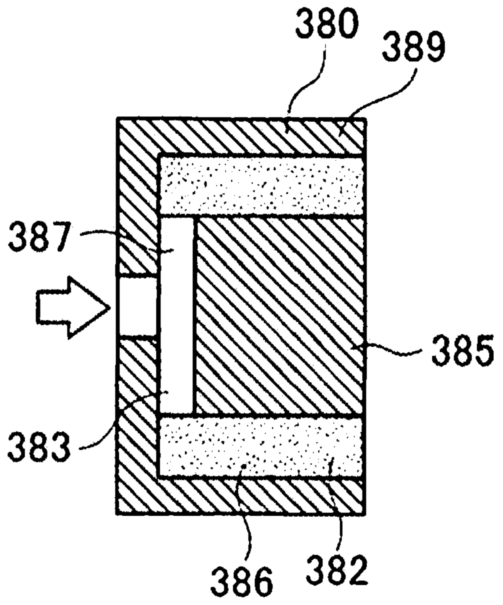

In addition, as shown in FIG. 12B, the mist filter main body 350 includes the outer vessel 380 having a cylindrical shape, the inner member 385, and the filling member 386 such as the sintered metal or the like filled in the gas path 382 disposed between the outer vessel 380 and the inner member 385. In a structure shown in FIG. 12A, while the entire gas path 382 disposed between the outer vessel 380 and the inner member 385 is filled with the filling member 386 such as the sintered metal or the like, in a structure shown in FIG. 12B, a space between a side surface 389 of the cylindrical outer vessel 380 and the inner member 385 in the gas path 382 disposed between the outer vessel 380 and the inner member 385 is filled with the filling member 386, and a space between an upper surface and a lower surface of the cylindrical outer vessel 380 and the inner member 385 is not filled with the filling member 386. Even in this case, the entire mist filter main body 350 may be integrated such that the heat can be effectively transferred to the inner member 385. The outer vessel 380 and the inner member 385 may be made of, preferably, a metal member, and more preferably, stainless used steel (SUS).

In a variant of the above-mentioned embodiment, stainless used steel (SUS) may be used as the sintered metal filled in the spaces 313, 323, 333 and 343 or the gas path 382. Otherwise, nickel (Ni) may be used. In addition, a Teflon (a registered trademark)-based material or ceramics may be used instead of the sintered metal.

In addition, as shown in FIG. 2, the pipe 232*a* is installed between the evaporator 271*a* and the mist filter 300, and the evaporator 271*a* and the mist filter 300 are separately installed. Since the process chamber 201 is reduced in pressure and the mist filter 300 is installed closer to the process chamber 201 than the evaporator 271*a*, the mist filter 300 is installed at a lower pressure side than the evaporator 271*a*. Since the gas flows toward the low pressure side, separation of the evaporator 271*a* and the mist filter 300 may provide a fore flow period of the gas from the evaporator 271*a* toward the mist filter 300. As a result, the gas can collide with the plate 320 and the plate 330 in the mist filter 300 at a higher flow velocity.

Further, as shown in FIG. 2, the mist filter 300 is installed at a downstream side of the evaporator 271*a*, the gas filter 272*a* is installed at a downstream side thereof, and the gas filter 272*a* is connected to the process chamber 201 via the pipe 232*a*. The mist filter 300 and the gas filter 272*a* may be installed as close to the process chamber 201 as possible. This is because the pressure in the mist filter 300 can be further reduced due to the pressure loss of the pipe 232*a* from the evaporator 271*a* to the process chamber 201 as they are installed near the process chamber 201. As the pressure in the mist filter 300 is further reduced, the evaporation can be easily performed and the bad evaporation can be suppressed.

The substrate processing apparatus of the exemplary embodiment of the present invention will be described with reference to the accompanying drawings. The substrate processing apparatus is exemplarily configured as a semiconductor manufacturing apparatus configured to perform a film-forming process, which is a substrate processing process of a method of manufacturing an integrated circuit (IC) serving as a semiconductor device. In addition, hereinafter, the case in which a batch type vertical apparatus (which may hereinafter be simply referred to as a processing apparatus) configured to perform oxidation, nitridation, diffusion processing or CVD processing on a substrate is used as the substrate processing apparatus will be described.

Figure 13:
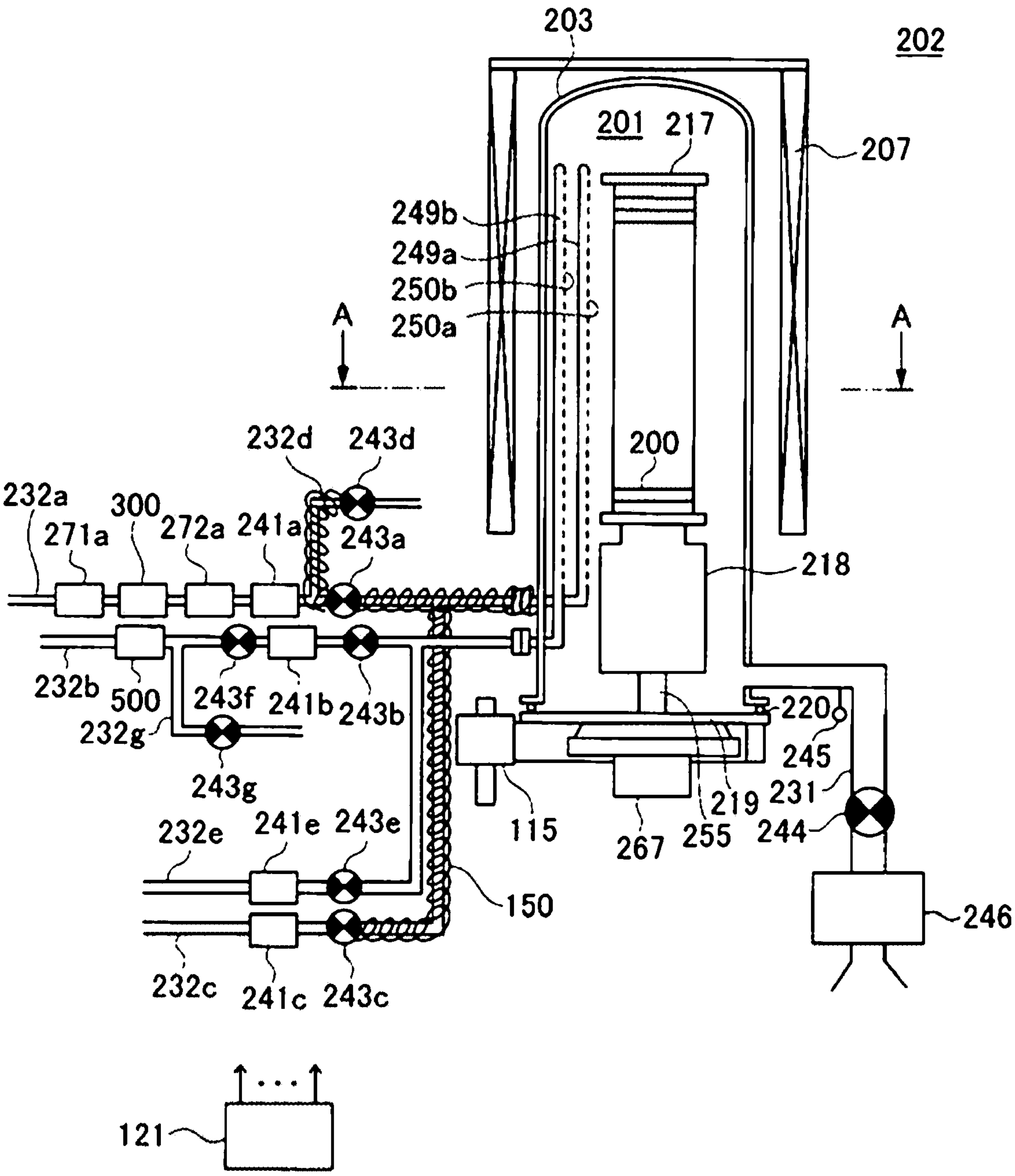
FIG. 13 is a schematic longitudinal cross-sectional view for describing a substrate processing apparatus of an exemplary embodiment of the present invention.
Figure 14:
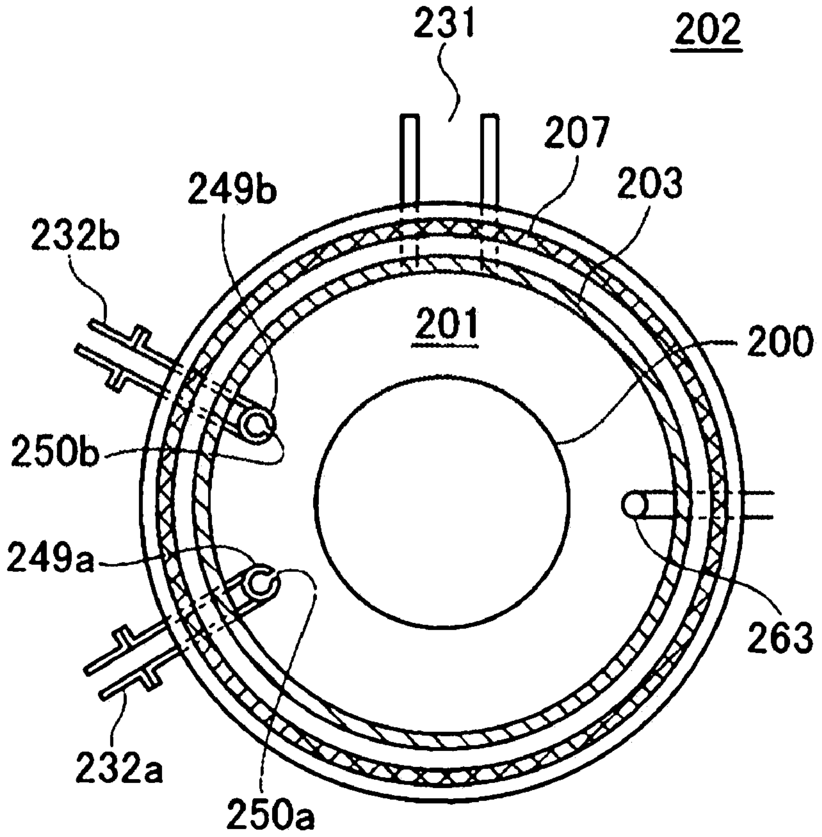
FIG. 14 is a schematic horizontal cross-sectional view taken along line A-A of FIG. 13.
Figure 15:
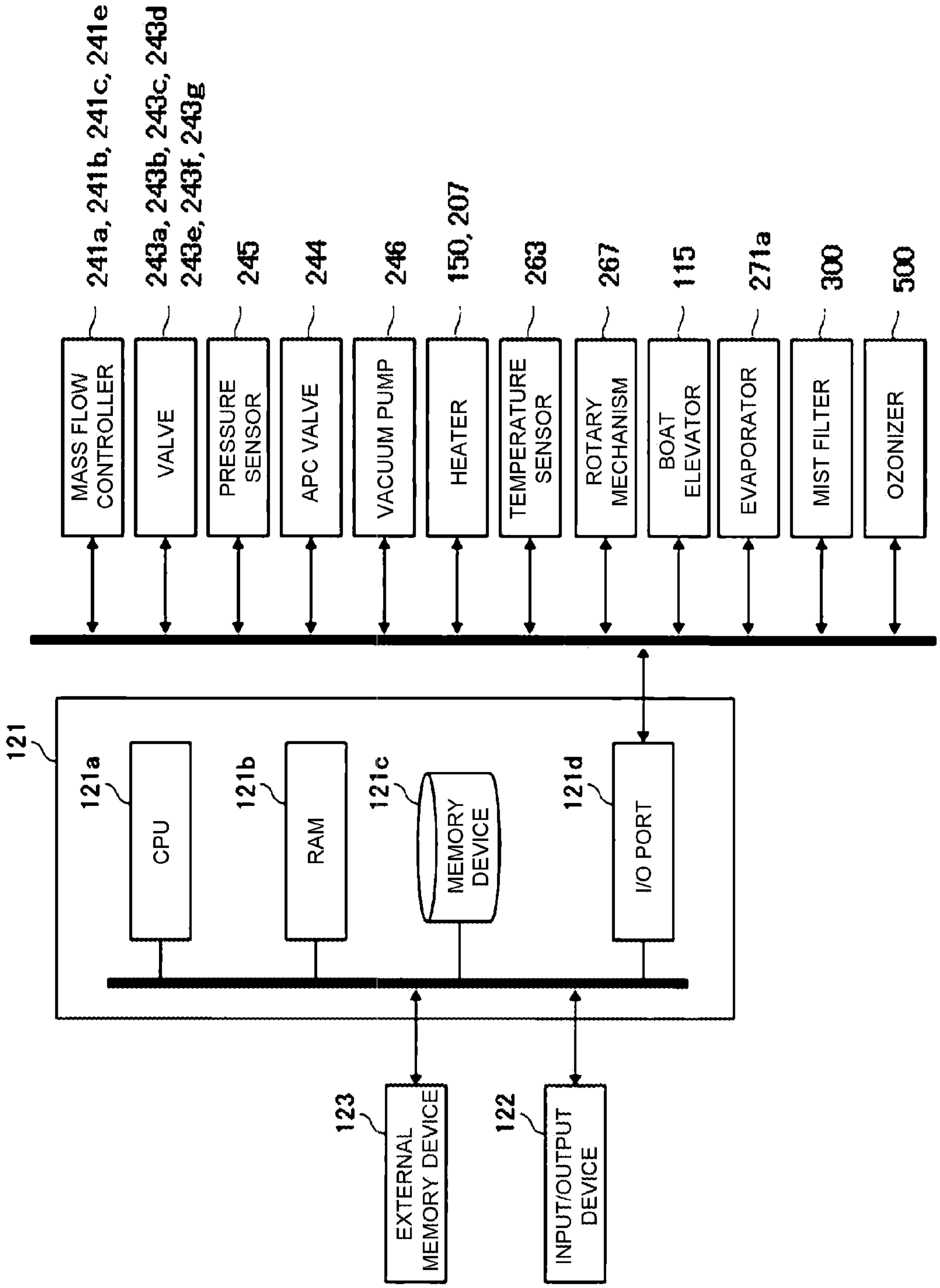
FIG. 15 is a block diagram showing a configuration of a controller included in the substrate processing apparatus shown in FIG. 13.

FIG. 13 is a schematic configuration view of a vertical processing furnace of the substrate processing apparatus of the embodiment, showing a processing furnace 202 in a longitudinal cross-sectional view, and FIG. 14 is a schematic configuration view of the vertical processing furnace of the substrate processing apparatus of the embodiment, showing the processing furnace 202 in a horizontal cross-sectional view. FIG. 15 shows a configuration of a controller included in the substrate processing apparatus shown in FIG. 13.

As shown in FIG. 13, the processing furnace 202 includes a heater 207 serving as a heating unit (a heating mechanism). The heater 207 has a cylindrical shape, and is supported by a heater base (not shown) serving as a holding plate to be vertically installed. A reaction tube 203 constituting a reaction vessel (a processing vessel) is installed concentrically with the heater 207 inside the heater 207.

A seal cap 219 serving as a furnace port cover configured to hermetically seal the lower end opening of the reaction tube 203 is installed under the reaction tube 203. The seal cap 219 abuts a lower end of the reaction tube 203 from a lower side in a vertical direction. The seal cap 219 is made of a metal such as stainless steel or the like, and has a disc shape. An O-ring 220 serving as a seal member configured to abut the lower end of the reaction tube 203 is installed at the upper surface of the seal cap 219. A rotary mechanism 267 configured to rotate the boat is installed at the seal cap 219 opposite to the process chamber 201. A rotary shaft 255 of the rotary mechanism 267 passes through the seal cap 219 to be connected to a boat 217 (to be described below), and is configured to rotate the boat 217 to rotate the wafer 200. The seal cap 219 is configured to be raised and lowered in the vertical direction by a boat elevator 115 serving as an elevation mechanism vertically installed at the outside of the reaction tube 203, and thus the boat 217 can be loaded and unloaded into/from the inside of the process chamber 201.

The boat 217 serving as a substrate holding unit (a holder) is vertically installed at the seal cap 219 via a quartz cap 218 serving as an insulating member. The quartz cap 218 is a holding body made of a heat resistance material such as quartz, silicon carbide, or the like, serving as an insulating section, and configured to hold the boat. The boat 217 is made of a heat resistance material such as quartz, silicon carbide, or the like, and configured to concentrically support the wafers 200 in a horizontal posture and in a tube axis direction in a multi-stage.

A nozzle 249*a* and a nozzle 249*b* are installed in the process chamber 201 and under the reaction tube 203 to pass through the reaction tube 203. The gas supply pipe 232*a* and a gas supply pipe 232*b* are connected to the nozzle 249*a* and the nozzle 249*b*, respectively. As described above, the two nozzles 249*a* and 249*b* and the two gas supply pipes 232*a* and 232*b* are installed at the reaction tube 203 so that multiple types of gases can be supplied into the process chamber 201. In addition, as will be described below, inert gas supply pipes 232*c* and 232*e* or the like are connected to the gas supply pipe 232*a* and the gas supply pipe 232*b*, respectively.

The evaporator 271*a* serving as an evaporating apparatus (an evaporating unit) and configured to evaporate the liquid source to generate an evaporated gas serving as a source gas, the mist filter 300, the gas filter 272*a*, a mass flow controller (MFC) 241*a* serving as a flow rate controller (a flow rate control unit), and a valve 243*a* serving as an opening/closing valve are installed at the gas supply pipe 232*a* in sequence from the upstream direction. As the valve 243*a* is opened, the evaporated gas generated in the evaporator 271*a* is supplied into the process chamber 201 via the nozzle 249*a*. A vent line 232*d* connected to an exhaust pipe 231 (to be described below) is connected to the gas supply pipe 232*a* between the mass flow controller 241*a* and the valve 243*a*.

A valve 243*d* serving as an opening/closing valve is installed at the vent line 232*d* to supply the source gas to the vent line 232*d* via the valve 243*d* when the source gas (to be described below) is not supplied into the process chamber 201. As the valve 243*a* is closed and the valve 243*d* is opened, the supply of the evaporated gas into the process chamber 201 can be stopped while maintaining generation of the evaporated gas in the evaporator 271*a*. While a predetermined time is needed to stably generate the evaporated gas, supply/stoppage of the evaporated gas into the process chamber 201 can be switched for an extremely short time by a switching operation of the valve 243*a* and the valve 243*d*. In addition, an inert gas supply pipe 232*c* is connected to the gas supply pipe 232*a* at a downstream side of the valve 243*a*. A mass flow controller 241*c* serving as a flow rate controller (a flow rate control unit) and a valve 243*c* serving as an opening/closing valve are installed at the inert gas supply pipe 232*c* in sequence from the upstream direction. The heater 150 is installed at the gas supply pipe 232*a*, the inert gas supply pipe 232*c*, and the vent line 232*d* to prevent reliquefaction.

The above-mentioned nozzle 249*a* is connected to the tip section of the gas supply pipe 232*a*. The nozzle 249*a* is installed to be raised in an arc-shaped space between the inner wall of the reaction tube 203 and the wafer 200 from a lower portion to an upper portion of the inner wall of the reaction tube 203 upward in the stacking direction of the wafers 200. The nozzle 249*a* is constituted as an L-shaped long nozzle. A gas supply hole 250*a* configured to supply a gas is installed at a side surface of the nozzle 249*a*. The gas supply hole 250*a* is opened toward a center of the reaction tube 203. The gas supply holes 250*a* are installed from the lower portion to the upper portion of the reaction tube 203, have the same opening area, and are disposed at the same opening pitch.

A first gas supply system is mainly constituted by the gas supply pipe 232*a*, the vent line 232*d*, the valves 243*a* and 243*d*, the mass flow controller 241*a*, the evaporator 271*a*, the mist filter 300, the gas filter 272*a*, and the nozzle 249*a*. In addition, a first inert gas supply system is mainly constituted by the inert gas supply pipe 232*c*, the mass flow controller 241*c*, and the valve 243*c*.

An ozonizer 500 serving as an apparatus for generating ozone ($O_3$) gas, a valve 243*f*, a mass flow controller (MFC) 241*b* serving as a flow rate controller (a flow rate control unit), and a valve 243*b* serving as an opening/closing valve are installed at the gas supply pipe 232*b* in sequence from the upstream direction. An upstream side of the gas supply pipe 232*b* is connected to an oxygen gas supply source (not shown) configured to supply oxygen ($O_2$) gas. The $O_2$ gas supplied into the ozonizer 500 becomes the $O_3$ gas) in the ozonizer 500 to be supplied into the process chamber 201. A vent line 232*g* connected to the exhaust pipe 231 (to be described below) is connected to the gas supply pipe 232*b* between the ozonizer 500 and the valve 243*f*. A valve 243*g* serving as an opening/closing valve is installed at the vent line 232*g* to supply the source gas to the vent line 232*g* via the valve 243*g* when the $O_3$ gas) is not supplied into the process chamber 201 (to be described later). As the valve 243*f* is closed and the valve 243*g* is opened, the supply of the $O_3$ gas) into the process chamber 201 can be stopped while maintaining generation of the $O_3$ gas) by the ozonizer 500. While a predetermined time is needed to stably refine the $O_3$ gas), the supply/stoppage of the $O_3$ gas) into the process chamber 201 can be switched for an extremely short time by the switching operation of the valve 243*f* and the valve 243*g*. In addition, an inert gas supply pipe 232*e* is connected to the gas supply pipe 232*b* at the downstream side of the valve 243*b*. A mass flow controller 241*e* serving as a flow rate controller (a flow rate control unit) and a valve 243*e* serving as an opening/closing valve are installed at the inert gas supply pipe 232*e* in sequence from the upstream direction.

The above-mentioned nozzle 249*b* is connected to the tip section of the gas supply pipe 232*b*. The nozzle 249*b* is installed to be raised and lowered in an arc-shaped space between the inner wall of the reaction tube 203 and the wafer 200 from the lower portion to the upper portion of the inner wall of the reaction tube 203 upward in the stacking direction of the wafers 200. The nozzle 249*b* is constituted as an L-shaped long nozzle. A gas supply hole 250*b* configured to supply a gas is installed at a side surface of the nozzle 249*b*. The gas supply hole 250*b* is opened toward the center of the reaction tube 203. The gas supply holes 250*b* are installed from the lower portion to the upper portion of the reaction tube 203, have the same opening area, and are disposed at the same opening pitch.

A second gas supply system is mainly constituted by the gas supply pipe 232*b*, the vent line 232*g*, the ozonizer 500, the valves 243*f*, 243*g* and 243*b*, the mass flow controller 241*b*, and the nozzle 249*b*. In addition, a second inert gas supply system is mainly constituted by the inert gas supply pipe 232*e*, the mass flow controller 241*e*, and the valve 243*e*.

For example, a zirconium source gas, i.e., a gas containing zirconium (Zr) (a zirconium-containing gas), which is a first source gas, is supplied from the gas supply pipe 232*a* into the process chamber 201 via the evaporator 271*a*, the mist filter 300, the gas filter 272*a*, the mass flow controller 241*a*, the valve 243*a*, and the nozzle 249*a*. For example, tetrakis (ethylmethylamino)zirconium (TEMAZ) may be used as the zirconium-containing gas. Tetrakis(ethylmethylamino)zirconium (TEMAZ) is a liquid at a normal temperature and a normal pressure.

A gas containing oxygen (O) (an oxygen-containing gas), for example, $O_2$ gas, is supplied into the gas supply pipe 232*b*, becomes $O_3$ gas) in the ozonizer 500, and is supplied into the process chamber 201 via the valve 243*f*, the mass flow controller 241*b*, and the valve 243*b* as an oxidizing gas (oxidant). The 02 gas serving as the oxidizing gas may be supplied into the process chamber 201 without generating the $O_3$ gas) in the ozonizer 500.

For example, nitrogen ($N_2$) gas is supplied from the inert gas supply pipes 232*c* and 232*e* into the process chamber 201 via the mass flow controllers 241*c* and 241*e*, the valves 243*c* and 243*e*, the gas supply pipes 232*a* and 232*b*, the nozzles 249*a* and 249*b*.

The exhaust pipe 231 configured to exhaust an atmosphere in the process chamber 201 is installed in the reaction tube 203. A vacuum pump 246 serving as a vacuum exhaust apparatus is connected to the exhaust pipe 231 via a pressure sensor 245 serving as a pressure detector (a pressure detection unit) configured to detect the pressure in the process chamber 201 and an auto pressure controller (APC) valve 244 serving as a pressure regulator (a pressure regulation unit) to perform vacuum exhaust so that the pressure in the process chamber 201 arrives at a predetermined pressure (a vacuum level). In addition, the APC valve 244 is an opening/closing valve configured to open and close the valve to perform the vacuum exhaust and stop the vacuum exhaust of the inside of the process chamber 201 and adjust the valve opening angle to regulate the pressure. An exhaust system is mainly constituted by the exhaust pipe 231, the APC valve 244, the vacuum pump 246, and the pressure sensor 245.

A temperature sensor 263 serving as a temperature detector is installed in the reaction tube 203, and an electrical connection state to the heater 207 is controlled based on temperature information detected by the temperature sensor 263 so that the temperature in the process chamber 201 arrives at a desired temperature distribution. The temperature sensor 263 has an L shape similar to the nozzles 249*a* and 249*b*, and is installed along the inner wall of the reaction tube 203.

As shown in FIG. 15, a controller 121 serving as a control unit (a control means) is constituted as a computer including a central processing unit (CPU) 121*a*, a random access memory (RAM) 121*b*, a memory device 121*c*, and an I/O port 121*d*. The RAM 121*b*, the memory device 121*c* and the I/O port 121*d* are configured to exchange data with the CPU 121*a* via an internal bus. An input/output device 122 constituted as, for example, a touch panel or the like is connected to the controller 121. In addition, an external memory device (a recording medium) 123 on which a program (to be described later) is stored is connectable to the controller 121.

The memory device 121*c* is constituted by, for example, a flash memory, a hard disk drive (HDD), or the like. A control program configured to control an operation of the substrate processing apparatus or a process recipe on which a sequence or condition of substrate processing (to be described later) is disclosed is readably stored in the memory device 121*c*. In addition, the control program or the process recipe can be stored in the memory device 121*c* by storing the control program or the process recipe in an external memory device 123 and connecting the external memory device 123 to the controller 121. Further, the process recipe is assembled to obtain a predetermined result by causing the controller 121 to perform the sequences of the following substrate processing process, and functions as a program. Hereinafter, the process recipe or the control program is also generally and simply referred to as a program. In addition, the case in which the terms of the program are recited in the description may include the case in which only the process recipe is included, the case in which only the control program is included, and the case in which both are included. Further, the RAM 121*b* is constituted as a memory region (a work area) in which a program or data read by the CPU 121*a* is temporarily held.

The I/O port 121*d* is connected to the mass flow controllers 241*a*, 241*b*, 241*c* and 241*e*, the valves 243*a*, 243*b*, 243*c*, 243*d*, 243*e*, 243*f* and 243*g*, the evaporator 271*a*, the mist filter 300, the ozonizer 500, the pressure sensor 245, the APC valve 244, the vacuum pump 246, the heaters 150 and 207, the temperature sensor 263, the boat rotary mechanism 267, the boat elevator 115, and so on.

The CPU 121*a* is configured to read and perform the control program from the memory device 121*c* and read the process recipe from the memory device 121*c* according to an input of an operation command from the input/output device 122. Then, the CPU 121*a* performs a flow rate control operation on various gases by the mass flow controllers 241*a*, 241*b*, 241*c* and 241*e*, an opening/closing operation on the valves 243*a*, 243*b*, 243*c*, 243*d*, 243*e*, 243*f* and 243*g*, a pressure regulation operation based on opening/closing of the APC valve 244 and the pressure sensor 245, a temperature control operation on the heater 150, a temperature control operation on the heater 207 based on the temperature sensor 263, control on the evaporator 271*a*, the mist filter 300 (the heater 360) and the ozonizer 500, start/stoppage on the vacuum pump 246, a rotational speed adjustment operation on the boat rotary mechanism 267, an elevation operation on the boat elevator 115, or the like, according to the read process recipe.

Next, a sequence example of forming an insulating film on a substrate, which is one process of processes of manufacturing a semiconductor device using a processing furnace of the above-mentioned substrate processing apparatus will be described with reference to FIGS. 16 and 17. In addition, in the following description, operations of the respective parts constituting the substrate processing apparatus are controlled by the controller 121.

In a chemical vapor deposition (CVD) method, for example, multiple types of gases including a plurality of elements constituting a film are simultaneously supplied. In addition, a film-forming method of alternately supplying multiple types of gases including a plurality of elements constituting a film is also provided.

Figure 16:
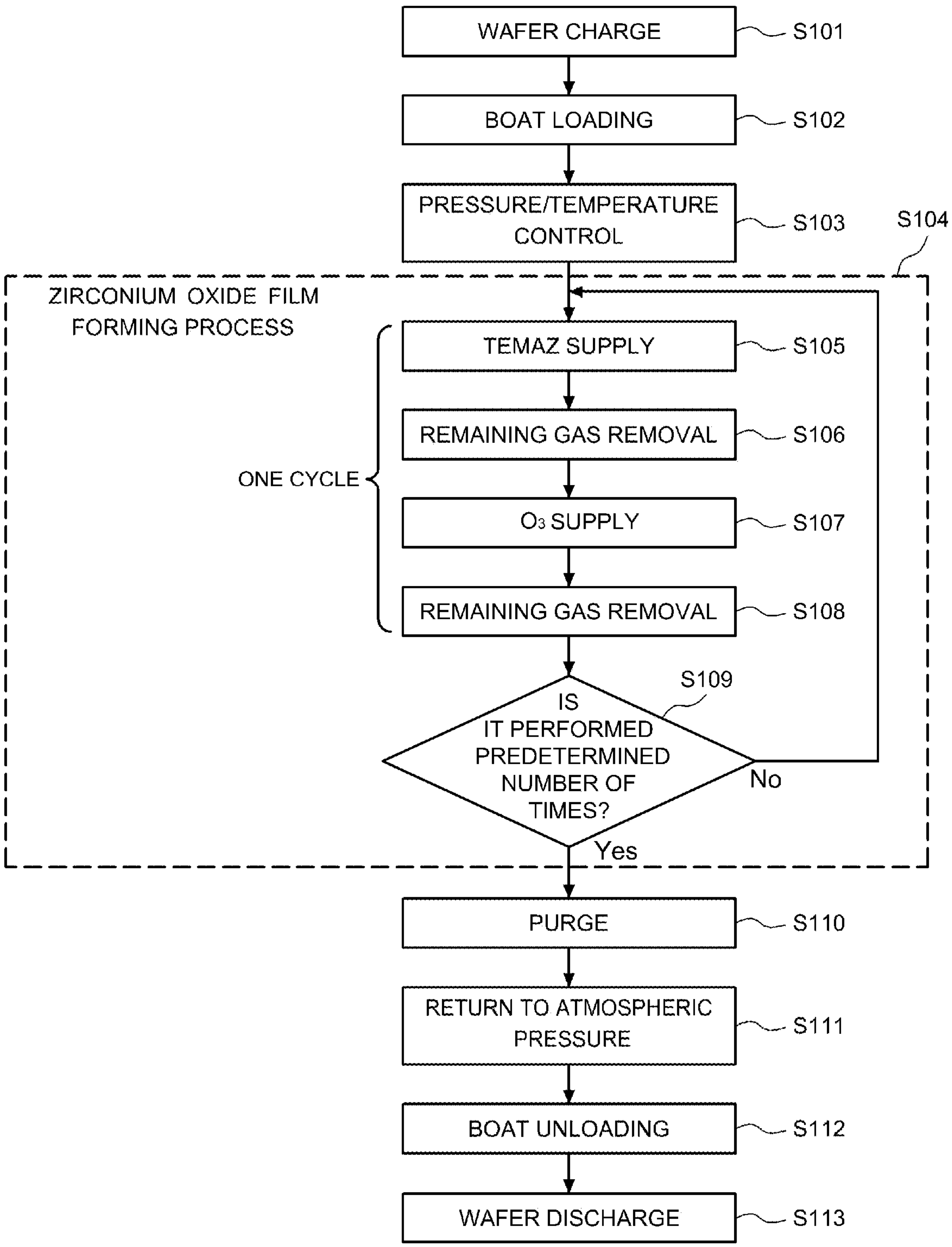
FIG. 16 is a flowchart for describing a process of manufacturing a zirconium oxide film using the substrate processing apparatus of the exemplary embodiment of the present invention.

First, when the wafers 200 are charged into the boat 217 (wafer charging) (see step S101 in FIG. 16), as shown in FIG. 13, the boat 217 supporting the wafers 200 is raised by the boat elevator 115 to be loaded into the process chamber 201 (boat loading) (see step S102 in FIG. 16). In this state, the seal cap 219 hermetically seals the lower end of the reaction tube 203 via the O-ring 220.

The inside of the process chamber 201 is vacuum-exhausted by the vacuum pump 246 to a desired pressure (a vacuum level). Here, the pressure in the process chamber 201 is measured by the pressure sensor 245, and the APC valve 244 is feedback-controlled based on the measured pressure (pressure regulation) (see step S103 in FIG. 16). In addition, the inside of the process chamber 201 is heated by the heater 207 to a desired temperature. Here, an electrical conduction state to the heater 207 is feedback-controlled based on temperature information detected by the temperature sensor 263 such that the inside of the process chamber 201 arrives at a desired temperature distribution (temperature control) (see step S103 in FIG. 16). Next, the boat 217 is rotated by the rotary mechanism 267 to rotate the wafer 200.

Next, as the TEMAZ gas and $O_3$ gas) are supplied into the process chamber 201, an insulating film forming process of forming a ZrO film serving as an insulating film is performed (see step S104 in FIG. 16). The following four steps are sequentially performed in the insulating film forming process.

(Insulating Film Forming Process)<Step S105>

In step S105 (see FIGS. 16 and 17, a first process), first, the TEMAZ gas flows. As the valve 243*a* of the gas supply pipe 232*a* is opened and the valve 243*d* of the vent line 232*d* is closed, the TEMAZ gas flows into the gas supply pipe 232*a* via the evaporator 271*a*, the mist filter 300 and the gas filter 272*a*. The TEMAZ gas flowing through the gas supply pipe 232*a* is flow-rate-controlled by the mass flow controller 241*a*. The flow-rate-controlled TEMAZ gas is supplied into the process chamber 201 from the gas supply hole 250*a* of the nozzle 249*a* and exhausted from the gas exhaust pipe 231. Here, simultaneously, the valve 243*c* is opened and an inert gas such as $N_2$ gas or the like flows into the inert gas supply pipe 232*c*. The $N_2$ gas flowing through the inert gas supply pipe 232*c* is flow-rate-controlled by the mass flow controller 241*c*. The flow-rate-controlled $N_2$ gas is supplied into the process chamber 201 and exhausted from the gas exhaust pipe 231 with the TEMAZ gas. The TEMAZ gas is supplied into the process chamber 201 to be reacted with the wafer 200 to form a zirconium-containing layer on the wafer 200. In addition, before performing step S105, the operation of the heater 360 of the mist filter 300 is controlled to maintain the temperature of the mist filter main body 350 at a desired temperature.

Here, the APC valve 244 is appropriately adjusted to regulate the pressure in the process chamber 201 to a pressure within a range of, for example, 50 to 400 Pa. A supply flow rate of the TEMAZ gas controlled by the mass flow controller 241*a* is set to a flow rate within a range of, for example, 0.1 to 0.5 g/min. A time in which the wafer 200 is exposed to the TEMAZ gas, i.e., a gas supply time (an irradiation time) is set to a time within a range of, for example, 30 to 240 seconds. Here, the temperature of the heater 207 is set such that the temperature of the wafer 200 is a temperature within a range of, for example, 150 to 250° C.

<Step S106>

In step S106 (FIGS. 16 and 17, a second process), after the zirconium-containing layer is formed, the valve 243*a* is closed and the valve 243*d* is opened to stop the supply of the TEMAZ gas into the process chamber 201, and the TEMAZ gas flows through the vent line 232*d*. Here, the inside of the process chamber 201 is vacuum-exhausted by the vacuum pump 246 in a state in which the APC valve 244 of the gas exhaust pipe 231 is open, and the TEMAZ gas that is not reacted or has contributed to formation of the zirconium-containing layer and remains in the process chamber 201 is removed from the process chamber 201. In addition, here, supply of the $N_2$ gas into the process chamber 201 is maintained in a state in which the valve 243*c* is open. Accordingly, an effect of removing the TEMAZ gas that is not reacted or has contributed to formation of the zirconium-containing layer and remains in the process chamber 201 from the inside of the process chamber 201 is improved. A rare gas such as Ar gas, He gas, Ne gas, Xe gas, or the like, in addition to the $N_2$ gas may be used as the inert gas.

<Step S107>

In step S107 (FIGS. 16 and 17, a third process), after removing the remaining gas in the process chamber 201, the 02 gas flows into the gas supply pipe 232*b*. The 02 gas flowing through the gas supply pipe 232*b* becomes $O_3$ gas) in the ozonizer 500. As the valve 243*f* and the valve 243*b* of the gas supply pipe 232*b* are opened and the valve 243*g* of the vent line 232*g* is closed, the $O_3$ gas) flowing through the gas supply pipe 232*b* is flow-rate-controlled by the mass flow controller 241*b*, supplied into the process chamber 201 from the gas supply hole 250*b* of the nozzle 249*b*, and exhausted from the gas exhaust pipe 231. Here, simultaneously, the valve 243*e* is opened, and the $N_2$ gas flows into the inert gas supply pipe 232*e*. The $N_2$ gas is supplied into the process chamber 201 and exhausted from the gas exhaust pipe 231 with the $O_3$ gas). As the $O_3$ gas) is supplied into the process chamber 201, the zirconium-containing layer formed on the wafer 200 is reacted with the $O_3$ gas) to form a ZrO layer.

When the $O_3$ gas) flows, the APC valve 244 is appropriately adjusted such that the pressure in the process chamber 201 arrives at a pressure within a range of, for example, 50 to 400 Pa. A supply flow rate of the $O_3$ gas) controlled by the mass flow controller 241*b* is set to a flow rate within a range of, for example, 10 to 20 slm. A time in which the wafer 200 is exposed to the $O_3$ gas), i.e., a gas supply time (an irradiation time) is set to a time within a range of, for example, 60 to 300 seconds. Here, the temperature of the heater 207 is set such that the temperature of the wafer 200 is set to a temperature within a range of 150 to 250° C. similar to step 105.

<Step S108)>

In step S108 (FIGS. 16 and 17, a fourth process), the valve 243*b* of the gas supply pipe 232*b* is closed and the valve 243*g* is opened to stop the supply of the $O_3$ gas) into the process chamber 201, and the $O_3$ gas) flows through the vent line 232*g*. Here, the inside of the process chamber 201 is vacuum-exhausted by the vacuum pump 246 in a state in which the APC valve 244 of the gas exhaust pipe 231 is open, the $O_3$ gas) that is not reacted or has contributed to oxidation and remains in the process chamber 201 is removed from the process chamber 201. In addition, here, supply of the $N_2$ gas into the process chamber 201 is maintained in a state in which the valve 243*e* is open. Accordingly, an effect of removing the $O_3$ gas) that is not reacted or has contributed to oxidation and remains in the process chamber 201 from the inside of the process chamber 201 is increased. In addition to the $O_3$ gas), the 02 gas or the like may be used as the oxygen-containing gas.

As the above-mentioned steps S105 to S108 are set as one cycle and the cycle is performed at least one time (step S109), an insulating film containing zirconium and oxygen and having a predetermined film thickness, i.e., a ZrO film, can be formed on the wafer 200. In addition, the above-mentioned cycle may be repeated a plurality of times. Accordingly, a deposition film of the ZrO film is formed on the wafer 200.

After forming the ZrO film, the valve 243*a* of the gas supply pipe 232*a* is closed, the valve 243*b* of the gas supply pipe 232*b* is closed, the valve 243*c* of the inert gas supply pipe 232*c* is opened, the valve 243*e* of the inert gas supply pipe 232*e* is opened, and the $N_2$ gas flows into the process chamber 201. The $N_2$ gas serves as a purge gas, and thus the inside of the process chamber 201 is purged with an inert gas to remove the gas remaining in the process chamber 201 from the process chamber 201 (purge, step S110). After that, the atmosphere in the process chamber 201 is replaced with the inert gas, and the pressure in the process chamber 201 returns to a normal pressure (return to an atmospheric pressure, step S111).

After that, the seal cap 219 is lowered by the boat elevator 115 and a lower end of a manifold 209 is opened, and simultaneously, the processed wafer 200, which is held by the boat 217, is unloaded from the lower end of the manifold 209 to the outside of the reaction tube 203 (boat unloading, step S112). Next, the processed wafer 200 is discharged from the boat 217 (wafer discharge, step S112).

Example 1

The film-forming of the ZrO film was performed using the substrate processing furnace of the above-mentioned embodiment. In addition, for the purpose of comparison, the film-forming of the ZrO film was performed without installing the mist filter 300. In the configuration in which the mist filter 300 was not installed, the film-forming was performed under conditions in which an evaporation source material TEMAZ was 0.45 g, a supply time was 300 sec, and a cycle number was 75 cycles. Step coverage in the film-forming was 81%. On the other hand, in the configuration in which the mist filter 300 was installed, since an evaporation flow rate could be increased, when the film-forming was performed under conditions in which the evaporation source material TEMAZ was 3 g, the supply time was 60 sec, and the cycle number was 75 cycles, the step coverage was 91%, which led to improvement of the step coverage. In addition, generation of the particles could be suppressed.

As described above specifically, when the liquid source that cannot be easily evaporated is used or a large evaporation flow rate is needed in the exemplary embodiment of the present invention, the bad evaporation can be suppressed. As a result, the following effects can be obtained.

(1) The gas filter clogging can be suppressed, and the maintenance can be reduced or the filter exchange period can be increased.

(2) The film-forming in which the particles are removed or suppressed can be performed.

(3) Step coverage of the pattern wafer is improved.

While the film-forming of the ZrO film has been performed in the above-mentioned embodiment, the technique using the mist filter 300 may be applied to other types of films, for example, a high permittivity (high-k) film such as ZrO, HfO, or the like, or a kind of film using an evaporator (in particular, a kind of film using a gas that can easily cause bad evaporation or requiring a large flow rate). In particular, the technique using the mist filter 300 may be applied to a kind of film using liquid source having a vapor pressure.

The technique using the mist filter 300 may be applied to the case of forming a metal carbide film of a metal nitride film including at least one metal element such as titanium (Ti), tantalum (Ta), cobalt (Co), tungsten (W), molybdenum (Mo), ruthenium (Ru), yttrium (Y), lanthanum (La), zirconium (Zr), hafnium (Hf), nickel (Ni), or the like, or a silicide film in which silicon (Si) is added to the above-mentioned film. Here, titanium chloride ($TiCl_4$), tetrakis(dimethylamino)titanium (TDMAT, $Ti[N(CH_3)_2]_4$), tetrakis(diethylamino)titanium (TDEAT, $Ti[N(CH_2CH_3)_2]_4$), or the like, may be used as a Ti-containing source material, tantalum chloride ($TaCl_4$) or the like may be used as a Ta-containing source material, $Co(AMD)[(tBu)NC(CH_3)N(tBu)_2Co]$ or the like may be used as a Co-containing source material, tungsten fluoride ($WF_6$) or the like may be used as a W-containing source material, molybdenum chloride ($MoCl_3$ or $MoCl_5$) or the like may be used as a Mo-containing source material, 2,4-dimethlypentadienyl(ethylcyclopentadienyl)ruthenium $[Ru(EtCp)(C_7H_{11})]$ or the like may be used as a Ru-containing source material, trisethylcyclopentadienylyttrium $[Y(C_2H_5C_5H_4)_3]$ or the like may be used as an Y-containing source material, trisisopropylcyclopentadienyllanthanum $[La(i\text{-}C_3H_7C_5H_4)_3]$ or the like may be used as a La-containing source material, tetrakis(ethylmethylamino)zirconium $[Zr(N[CH_3(C_2H_5)]_4)]$ or the like may be used as a Zr-containing source material, tetrakis(ethylmethylamino)hafnium $[Hf(N[CH_3(C_2H_5)]_4)]$ or the like may be used as a Hf-containing source material, nickelamidinate (NiAMD), cyclopentadienylallylnickel ($C_5H_5NiC_3H_5$), methylcyclopentadienylallylnickel $[(CH_3)C_5H_4NiC_3H_5]$, ethylcyclopentadienylallylnickel $[(C_2H_5)C_5H_4NiC_3H_5]$, $Ni(PF_3)_4$ or the like may be used as a Ni-containing source material, and tetrachlorosilane ($SiCl_4$), hexachlorodisilane ($Si_2Cl_6$), dichlorosilane ($SiH_2Cl_2$), trisdimethyl aminosilane ($SiH[N(CH_3)_2]_3$), bis-tertiary-butyl-amino-silane ($H_2Si[HNC(CH_3]_2$) or the like may be used as a Si-containing source material. TiCN, TiAlC, or the like may be used as a metal carbide film containing Ti. For example, $TiCl_4$, $Hf[C_5H_4(CH_3)]_2(CH_3)_2$ and $NH_3$ may be used as a source material of TiCN. In addition, for example, $TiCl_4$ and trimethylaluminum (TMA, $(CH_3)_3Al$) may be used as a source material of TiAlC. Further, $TiCl_4$, TMA and propylene ($C_3H_6$) may be used as a source material of TiAlC. Furthermore, TiAlN or the like may be used as a metal nitride film containing Ti. For example, $TiCl_4$, TMA and $NH_3$ may be used as a source material of TiAlN.

According to the present invention, an amount of particles generated when liquid source is used can be suppressed, and the liquid source can be efficiently evaporated to be supplied into a process chamber.

Exemplary Modes of the Invention

Hereinafter, exemplary modes of the present invention will be supplementarily stated.

(Supplementary Note 1)

A method of manufacturing a semiconductor device, including: (a) loading a substrate into a process chamber; (b) evaporating a source material by sequentially flowing the source material to an evaporator and a mist filter including one or more first plates and one or more second plates; (c) supplying the source material evaporated in the step (b) into the process chamber to process the substrate; and (d) unloading the substrate from the process chamber, wherein each of the one or more first plates includes one or more first holes, and each of the one or more second plates includes one or more second holes disposed at different positions from those of the one or more first holes.

(Supplementary Note 2)

The method of manufacturing the semiconductor device according to Supplementary Note 1, wherein the one or more first holes are disposed near an outer circumference of each of the one or more first plates, the one or more second holes are disposed near a center of each of the one or more second plates, and the one or more first plates and the one or more second plates are alternately disposed, and wherein the step (b) includes evaporating the source material passed through the evaporator by alternately flowing the source material through the one or more first holes and the one or more second holes.

(Supplementary Note 3)

The method of manufacturing the semiconductor device according to Supplementary Note 1 or 2, wherein the step (b) includes evaporating the source material sequentially flown through the evaporator and the mist filter by further flowing the source material through a gas filter.

(Supplementary Note 4)

A method of manufacturing a substrate, including: (a) loading a substrate into a process chamber; (b) evaporating a source material by sequentially flowing the source material to an evaporator and a mist filter including one or more first plates and one or more second plates; (c) supplying the source material evaporated in the step (b) into the process chamber to process the substrate; and (d) unloading the substrate from the process chamber, wherein each of the one or more first plates includes one or more first holes, and each of the one or more second plates includes one or more second holes disposed at different positions from those of the one or more first holes.

(Supplementary Note 5)

The method of manufacturing the substrate according to Supplementary Note 4, wherein the one or more first holes are disposed near an outer circumference of each of the one or more first plates, the one or more second holes are disposed near a center of each of the one or more second plates, and the one or more first plates and the one or more second plates are alternately disposed, and wherein the step (b) includes evaporating the source material passed through the evaporator by alternately flowing the source material through the one or more first holes and the one or more second holes.

(Supplementary Note 6)

The method of manufacturing the semiconductor device according to Supplementary Note 4 or 5, wherein the step (b) includes evaporating the source material sequentially flown through the evaporator and the mist filter by further flowing the source material through a gas filter.

(Supplementary Note 7)

A program performed by a control unit, the program including the sequences of: (a) loading a substrate into a process chamber; (b) evaporating a source material by sequentially flowing the source material to an evaporator and a mist filter including one or more first plates and one or more second plates; (c) supplying the source material evaporated in the step (b) into the process chamber to process the substrate; and (d) unloading the substrate from the process chamber, wherein each of the one or more first plates includes one or more first holes, and each of the one or more second plates includes one or more second holes disposed at different positions from those of the one or more first holes.

(Supplementary Note 8)

The program according to Supplementary Note 7, wherein the one or more first holes are disposed near an outer circumference of each of the one or more first plates, the one or more second holes are disposed near a center of each of the one or more second plates, and the one or more first plates and the one or more second plates are alternately disposed, and wherein the step (b) includes evaporating the source material passed through the evaporator by alternately flowing the source material through the one or more first holes and the one or more second holes.

(Supplementary Note 9)

The program according to Supplementary Note 7, wherein the sequence (b) includes evaporating the source material sequentially flown through the evaporator and the mist filter by further flowing the source material through a gas filter.

(Supplementary Note 10)

A non-transitory computer-readable recording medium on which a program performed by a control unit is recorded, the program including the sequences of: (a) loading a substrate into a process chamber; (b) evaporating a source material by sequentially flowing the source material to an evaporator and a mist filter including one or more first plates and one or more second plates; (c) supplying the source material evaporated in the step (b) into the process chamber to process the substrate; and (d) unloading the substrate from the process chamber, wherein each of the one or more first plates includes one or more first holes, and each of the one or more second plates includes one or more second holes disposed at different positions from those of the one or more first holes.

(Supplementary Note 11)

The non-transitory computer-readable recording medium according to Supplementary Note 10, wherein the one or more first holes are disposed near an outer circumference of each of the one or more first plates, the one or more second holes are disposed near a center of each of the one or more second plates, and the one or more first plates and the one or more second plates are alternately disposed, and wherein the step (b) includes evaporating the source material passed through the evaporator by alternately flowing the source material through the one or more first holes and the one or more second holes.

(Supplementary Note 12)

The non-transitory computer-readable recording medium according to Supplementary Note 10, wherein the sequence (b) includes evaporating the source material sequentially flown through the evaporator and the mist filter by further flowing the source material through a gas filter.

(Supplementary Note 13)

A substrate processing apparatus including: a process chamber configured to accommodate a substrate; a process gas supply system configured to supply a process gas into the process chamber; and an exhaust system configured to exhaust the process chamber, wherein the process gas supply system includes: an evaporator configured to receive a source material; and a mist filter disposed at a downstream side of the evaporator, and including one or more first plates and one or more second plates, wherein each of the one or more first plates includes one or more first holes, and each of the one or more second plates includes one or more second holes disposed at different positions from those of the one or more first holes.

(Supplementary Note 14)

The substrate processing apparatus according to Supplementary Note 13, wherein the one or more first holes are disposed near an outer circumference of each of the one or more first plates, the one or more second holes are disposed near a center of each of the one or more second plates, and the one or more first plates and the one or more second plates are alternately disposed.

(Supplementary Note 15)

The substrate processing apparatus according to Supplementary Note 13 or 14, wherein the process gas supply system further includes a gas filter disposed at a downstream side of the mist filter.

(Supplementary Note 16)

The substrate processing apparatus according to Supplementary Note 15, wherein the evaporator, the mist filter and the gas filter are separate from one another.

(Supplementary Note 17)

The substrate processing apparatus according to any one of Supplementary Notes 13 to 16, wherein the mist filter further includes a heater configured to heat the one or more first plates and the one or more second plates.

(Supplementary Note 18)

The substrate processing apparatus according to any one of Supplementary Notes 13 to 17, wherein each of the one or more first plates and the one or more second plates includes a metal.

(Supplementary Note 19)

The substrate processing apparatus according to any one of Supplementary Notes 13 to 18, wherein a shape of each of the one or more first plates is same as that of each of the one or more second plates except for the one or more first holes and the one or more second holes.

(Supplementary Note 20)

The substrate processing apparatus according to any one of Supplementary Notes 13 to 19, wherein each of the one or more first plates and the one or more second plates includes a plate section including one of the one or more first holes and the one or more second holes; and an outer circumferential section disposed at an outer circumference of the plate section, the outer circumferential section being thicker than the plate section, and the outer circumferential section of one of the one or more first plates is in contact with the outer circumferential section of one of the one or more second plates adjacent to the outer circumferential section of the one of the one or more first plates in a manner that a space is provided between the plate section of the one of the one or more first plates and the plate section of the one of the one or more second plates.

(Supplementary Note 21)

The substrate processing apparatus according to any one of Supplementary Notes 13 to 20, wherein a stepped portion is provided between a side surface of the outer circumferential section and a side surface of the plate section.

(Supplementary Note 22)

The substrate processing apparatus according to any one of Supplementary Notes 13 to 21, wherein a sintered metal is filled between the one or more first plates and the one or more second plates.

(Supplementary Note 23)

The substrate processing apparatus according to any one of Supplementary Notes 13 to 22, wherein the process gas is a zirconium-containing source material.

(Supplementary Note 24)

An evaporation system including: an evaporator configured to receive a source material; and a mist filter disposed at a downstream side of the evaporator and including one or more first plates and one or more second plates, wherein each of the one or more first plates includes one or more first holes, and each of the one or more second plates includes one or more second holes disposed at different positions from those of the one or more first holes.

(Supplementary Note 25)

The evaporation system according to Supplementary Note 24, wherein the one or more first holes are disposed near an outer circumference of each of the one or more first plates, the one or more second holes are disposed near a center of each of the one or more second plates, and the one or more first plates and the one or more second plates are alternately disposed.

(Supplementary Note 26)

The evaporation system according to Supplementary Note 24 or 25, further including a gas filter disposed at a downstream side of the mist filter.

(Supplementary Note 27)

The evaporation system according to Supplementary Note 26, the evaporator, the mist filter and the gas filter are separate from one another.

(Supplementary Note 28)

The evaporation system according to any one of Supplementary Notes 24 to 27, wherein the mist filter further includes a heater configured to heat the one or more first plates and the one or more second plates.

(Supplementary Note 29)

A mist filter constituted by assembling a plurality of at least two types of plates including holes disposed at different positions.

(Supplementary Note 30)

The mist filter according to Supplementary Note 29, wherein the mist filter is constituted by alternately disposing a first plate in which a plurality of holes are disposed near an outer circumference thereof and a second plate in which a plurality of holes are disposed near a center thereof.

(Supplementary Note 31)

The mist filter according to Supplementary Notes 29 or 30, including a heater configured to heat the at least two types of plates.

Hereinabove, while various exemplary embodiments of the present invention have been described, the present invention is not limited thereto. Accordingly, the scope of the present invention is limited by only the scopes of the accompanying claims.

What is claimed is:

1. A substrate processing method, comprising:

(a) supplying a source material comprising a metal to an evaporator, and generating a gas and a mist from the source material by evaporating the source material;

(b) supplying the gas and the mist to a mist filter to convert the mist into a gaseous state, wherein the mist filter is installed separately from the evaporator and a gas pipe heated by the evaporator and a first heater is interposed between the mist filter and the evaporator, the mist filter comprising:

a second heater, and a stacked structure a stacked structure formed by a plurality of first plates and a plurality of second plates being alternately engaged with each other at outer circumferential sections thereof, wherein each of the plurality of first plates comprise a first plate section provided with a first hole and a first outer circumferential section disposed at a position offset with respect to the first plate section, and the first plate section and the first outer circumferential section are integrated as a single body, wherein each of the plurality of second plates comprise a second plate section provided with a second hole disposed at a position different from that of the first hole and a second outer circumferential section disposed at a position offset with respect to the second plate section, and the second plate section and the second outer circumferential section are integrated as a single body, and wherein a length of the cylindrical stacked structure measured along a stacking direction is greater than an outer diameter thereof;

(c) supplying the gas from the mist filter into a gas filter to collect a particle generated in at least one of the evaporator or the mist filter;

(d) supplying the gas from the gas filter to a process chamber to form a layer comprising the metal on a substrate; and (e) after performing (a) and before performing (b), allowing the mist to flow through the gas pipe such that a flow velocity of the mist increases from an outlet side of the evaporator through the gas pipe toward the mist filter during a fore flow period in which the source material passes through the gas pipe, wherein the mist filter is provided between a flow rate controller installed at the gas pipe and the evaporator, and wherein during the fore flow period the flow rate controller controls the flow velocity of the mist through the gas pipe.

2. The substrate processing method of claim 1, wherein in (b), a temperature of the gas discharged from the mist filter is greater than that of the gas and the mist generated in (a).

3. The substrate processing method of claim 1, wherein the fore flow period is obtained by installing the mist filter closer to the process chamber than the evaporator.

4. The substrate processing method of claim 1, wherein in (b), the gas and the mist generated in (a) is heated by colliding the gas and the mist generated in (a) against wall surfaces of the first plate and the second plate.

5. The substrate processing method of claim 4, wherein the metal is zirconium.

6. The substrate processing method of claim 1, wherein in (b), the gas and the mist generated in (a) is heated in the gas path.

7. The substrate processing method of claim 1, wherein the first hole is disposed near an outer circumference of the first plate, and the second hole is disposed near a center of the second plate.

8. The substrate processing method of claim 1, wherein a diameter of each of the first hole and the second hole is 1 to 3 mm.

9. The substrate processing method of claim 1, wherein the gas and the mist generated in (a) is heated to reach 150° C.

10. The substrate processing method of claim 1, wherein a supply flow rate of the source material is 0.1 to 0.5 g/min.

11. The substrate processing method of claim 1, wherein the gas is provided from the gas filter to the process chamber via a valve.

12. The substrate processing method of claim 1, wherein the gas is provided from the gas filter to a valve via a mass flow controller.

13. The substrate processing method of claim 1, further comprising:

(f) supplying a reactive gas into the process chamber without passing through the mist filter and the gas filter; and (g) forming the layer comprising the metal on the substrate by performing (d) and (f) a predetermined number of times.

14. The substrate processing method of claim 1, wherein in (a), the source material in a liquid state is evaporated.

15. The substrate processing method of claim 1, further comprising:

(h) causing the mist whose flow velocity has been increased in (e) to collide against a plate of the mist filter.

16. The substrate processing method of claim 1, wherein end plates are provided at both ends of the cylindrical stacked structure of the first plate and the second plate, and wherein the gas path is formed inside the cylindrical stacked structure of the first plate and the second plate and between the cylindrical stacked structure and the end plates.

17. The substrate processing method of claim 1, wherein the second heater is configured to cover the cylindrical stacked structure of the first plate and the second plate.

18. The substrate processing method of claim 1, wherein the first hole is arranged throughout an entire outer circumference of the first plate, wherein the second hole is disposed near a center of the second plate, and wherein in (b), the mist flows by colliding against a center of the first plate; flowing through the first plate, then colliding against an outer circumference of the second plate and then flowing through the second hole.

19. The substrate processing method of claim 18, wherein the mist is converted into the gaseous state by being heated when colliding against the center of the first plate and the outer circumference of the second plate.

20. A method of manufacturing a semiconductor device, comprising the substrate processing method of claim 1.

* * * * *